(12) United States Patent
Rathinasamy et al.

(10) Patent No.: US 12,250,786 B2
(45) Date of Patent: Mar. 11, 2025

(54) HIGH-SPEED NETWORKING DEVICE MANUFACTURING SYSTEM

(71) Applicant: Dell Products L.P., Round Rock, TX (US)

(72) Inventors: Shree Rathinasamy, Round Rock, TX (US); Neal Beard, Austin, TX (US); Colin Montgomery, Mountain View, CA (US); Per Henrik Fremrot, Novato, CA (US)

(73) Assignee: Dell Products L.P., Round Rock, TX (US)

( * ) Notice: Subject to any disclaimer, the term of this patent is extended or adjusted under 35 U.S.C. 154(b) by 418 days.

(21) Appl. No.: 17/749,332

(22) Filed: May 20, 2022

(65) Prior Publication Data

US 2023/0380098 A1    Nov. 23, 2023

(51) Int. Cl.
*H04B 10/00* (2013.01)
*H04Q 11/00* (2006.01)
*H05K 7/14* (2006.01)
*H04J 14/00* (2006.01)

(52) U.S. Cl.
CPC ....... *H05K 7/1491* (2013.01); *H04Q 11/0067* (2013.01); *H04Q 11/0071* (2013.01)

(58) Field of Classification Search
CPC .. H04Q 1/02; H04Q 1/04; H04Q 1/06; H04Q 11/00; H04Q 11/04; H04Q 11/0421; H04Q 2201/00; H04Q 2201/12; H04Q 2201/16
See application file for complete search history.

(56) References Cited

U.S. PATENT DOCUMENTS

2018/0295737 A1* 10/2018 Balasubramanian .... H04Q 1/02

* cited by examiner

*Primary Examiner* — Daniel G Dobson
(74) *Attorney, Agent, or Firm* — Joseph Mencher

(57) ABSTRACT

A method for manufacturing networking devices includes providing circuit boards each having an NPU mounted to that circuit board, and respective cable connectors mounted to that circuit board and coupled to that NPU. First networking devices are manufactured by providing one of the circuit boards in a chassis in each first networking device, and cabling at least some of the cable connectors on that circuit board to first subsystem(s) in that first networking device in order to configure that first networking device to perform first functionality. Second networking devices are manufactured by providing a respective one of the circuit boards in a chassis in each second networking device, and cabling at least some of the cable connectors on that circuit board to second subsystem(s) in that second networking device in order to configure that second networking device to perform second functionality that is different than the first functionality.

20 Claims, 21 Drawing Sheets

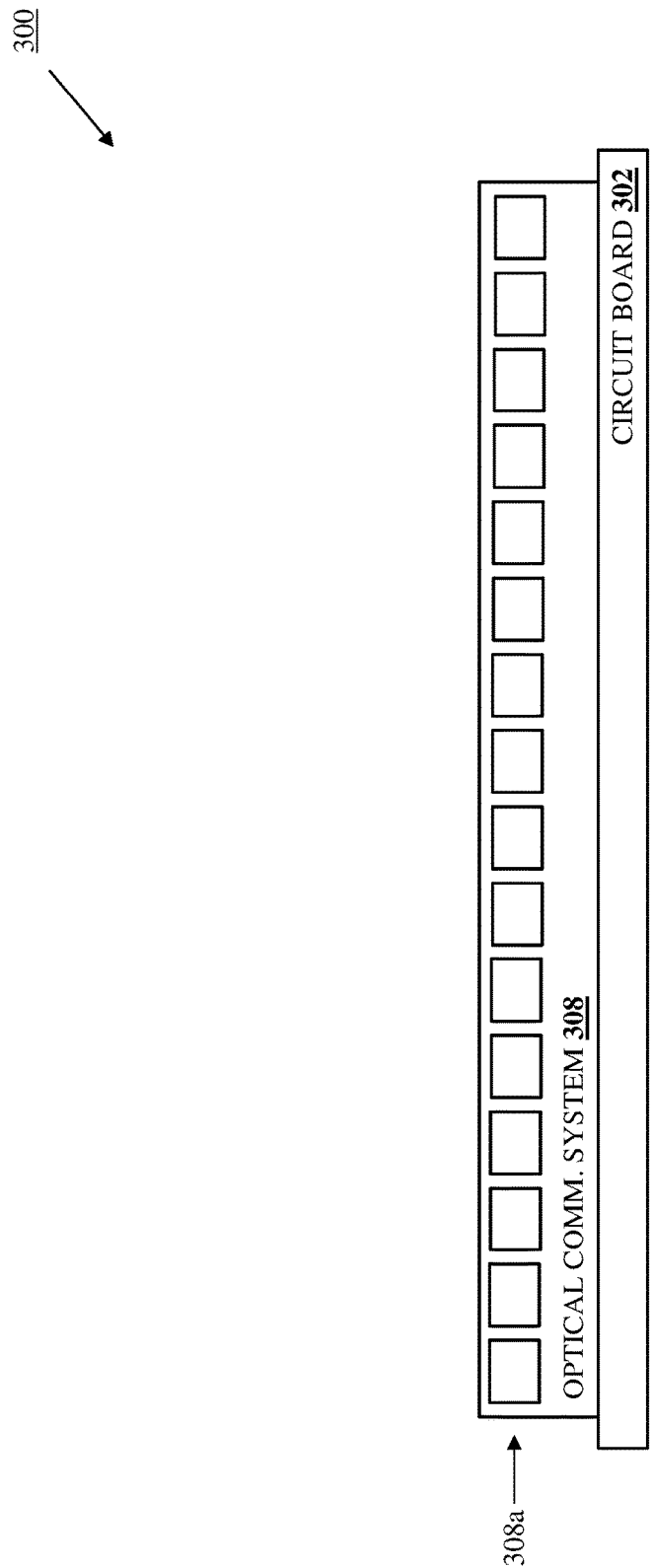

HIGH-SPEED NETWORKING DEVICE MANUFACTURING SYSTEM

BACKGROUND

The present disclosure relates generally to information handling systems, and more particularly to manufacturing different high-speed networking devices that provide different high-speed networking functionality each using a networking circuit board having the same configuration.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as networking devices (e.g., switch devices, Input/Output (I/O) modules, etc.) are often utilized in a variety of scenarios by users, requiring networking device manufacturers to manufacture different networking devices with networking device configurations that support those utilization scenarios. For example, a first subset of users may require 1 Rack Unit (1RU) switch devices for some rack-based networking device utilization scenarios, a second subset of users may require 2RU switch devices for other rack-based networking utilization scenarios, and a third subset of users may require chassis-based I/O modules for chassis-based networking device utilization scenarios. Furthermore, networking devices are often implemented in a Clos network (also called a "Clos mesh" or "Clos fabric") in which the user must interconnect the networking device(s) and other devices (e.g., via "external" connections within and/or between racks used in the rack-based networking device utilization scenarios discussed above, via "internal" connections between blade server devices, storage devices, and I/O modules in a common chassis used in the chassis-based networking device utilization scenarios discussed above, etc.).

As will be appreciated by one of skill in the art in possession of the present disclosure, networking device implementation techniques like Clos network implementations discussed above conventionally require different networking device configurations for the different networking device utilization scenarios. Furthermore, as networking data speeds increase to 100/200 Gigabit Ethernet (GbE) Serializer/Deserializer (SerDes) and beyond, the number of networking device configurations/utilization scenarios are expected to increase further due to the inability of circuit-board-based copper traces to support the corresponding high data transmission speeds. The issues discussed above generally increase the costs of manufacturing networking devices, as networking devices with any particular configuration that satisfies any particular networking device utilization scenario will require corresponding development costs.

Thus, networking devices with a networking device configuration that is optimized for any particular networking device utilization scenario are generally more expensive, particularly when that networking device utilization scenario is not required for a relatively large number of users. As such, many networking device manufacturers manufacture "general-purpose" networking devices having networking device configurations that are versatile enough to support several networking device utilization scenarios, which allows those networking device manufacturers to recover the corresponding development costs, but often result in the inefficient use of such general-purpose networking devices in networking device utilization scenarios for which they are not optimized. For example, many users utilize several such general-purpose networking devices in the Clos network implementations discussed above, which often requires the interconnection of those networking devices via data ports on those networking devices that could otherwise be connected to server devices or storage devices and used for the transmission of user data, and such issues are exacerbated when redundancy considerations require the connection of any two networking devices via multiple redundant links (i.e., requiring two "user data" ports on each networking devices to be dedicated to inter-networking device links).

Accordingly, it would be desirable to provide a high-speed networking device manufacturing system that addresses the issues discussed above.

SUMMARY

According to one embodiment, a method for manufacturing networking devices includes providing a plurality of networking circuit boards each having a networking circuit board configuration that includes a networking processing system mounted to that networking circuit board, and a respective plurality of cable connectors that are mounted to that networking circuit board and coupled to the networking processing system mounted to that networking circuit board; manufacturing each of a plurality of first networking devices by: providing a respective one of the plurality of networking circuit boards in a respective first networking device chassis in that first networking device; and cabling a first subset of the plurality of cable connectors on that respective one of the plurality of networking circuit boards to at least one first networking subsystem in that first networking device, and cabling a second subset of the plurality of cable connectors on that respective one of the plurality of networking circuit boards to at least one second networking subsystem in that first networking device, in order to configure that first networking device to perform first networking device functionality; and manufacturing each of a plurality of second networking devices by: providing a respective one of the plurality of networking circuit boards in a respective second networking device chassis in that second networking device; and cabling at least some of the plurality of cable connectors on that respective one of the plurality of networking circuit boards to at least one third networking subsystem in that second networking device in order to configure that second networking device to perform second networking device functionality that is different than the first networking device functionality.

BRIEF DESCRIPTION OF THE DRAWINGS

FIG. 3B is a schematic front view illustrating an embodiment of the networking circuit board of FIG. 3A.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
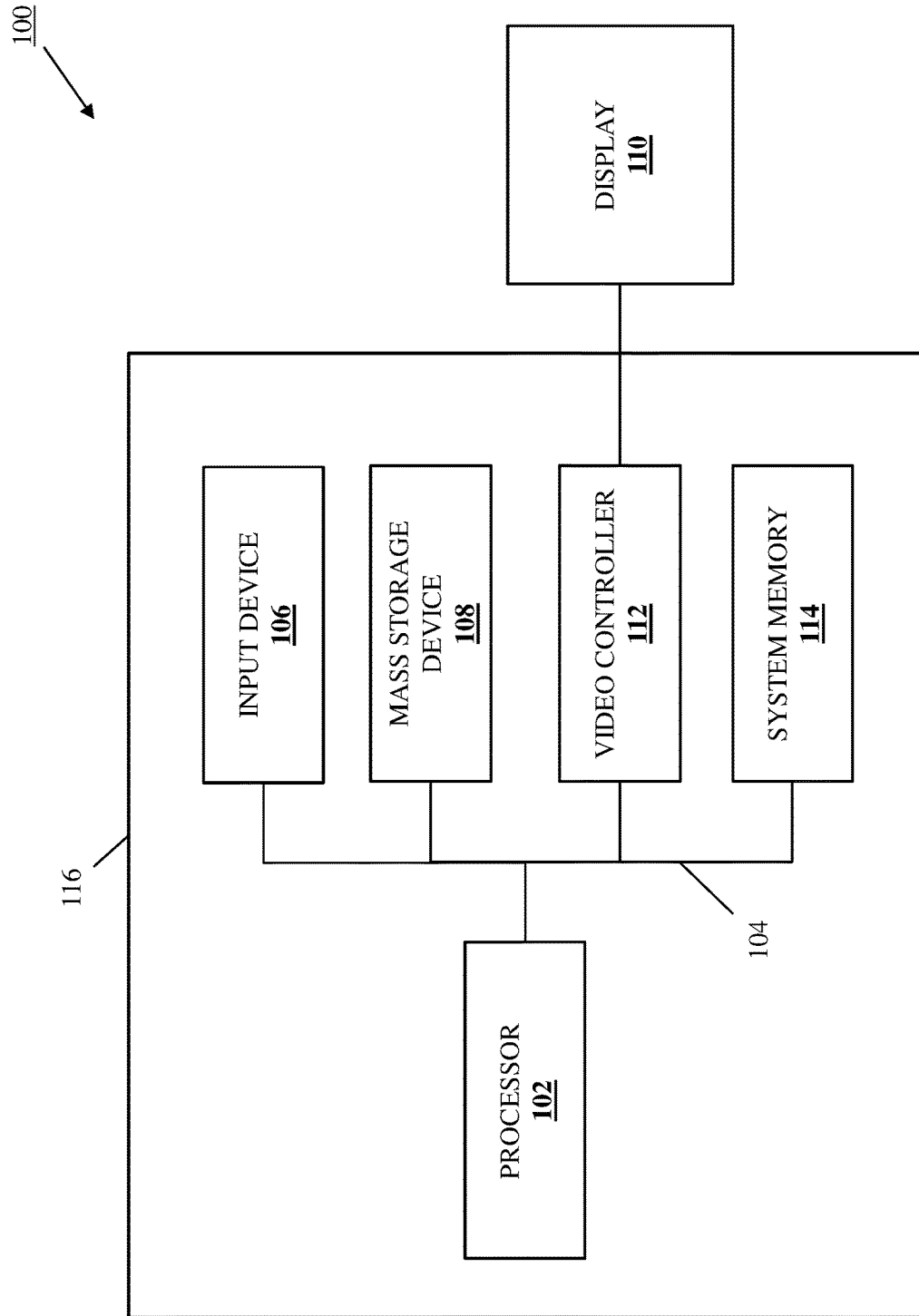
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
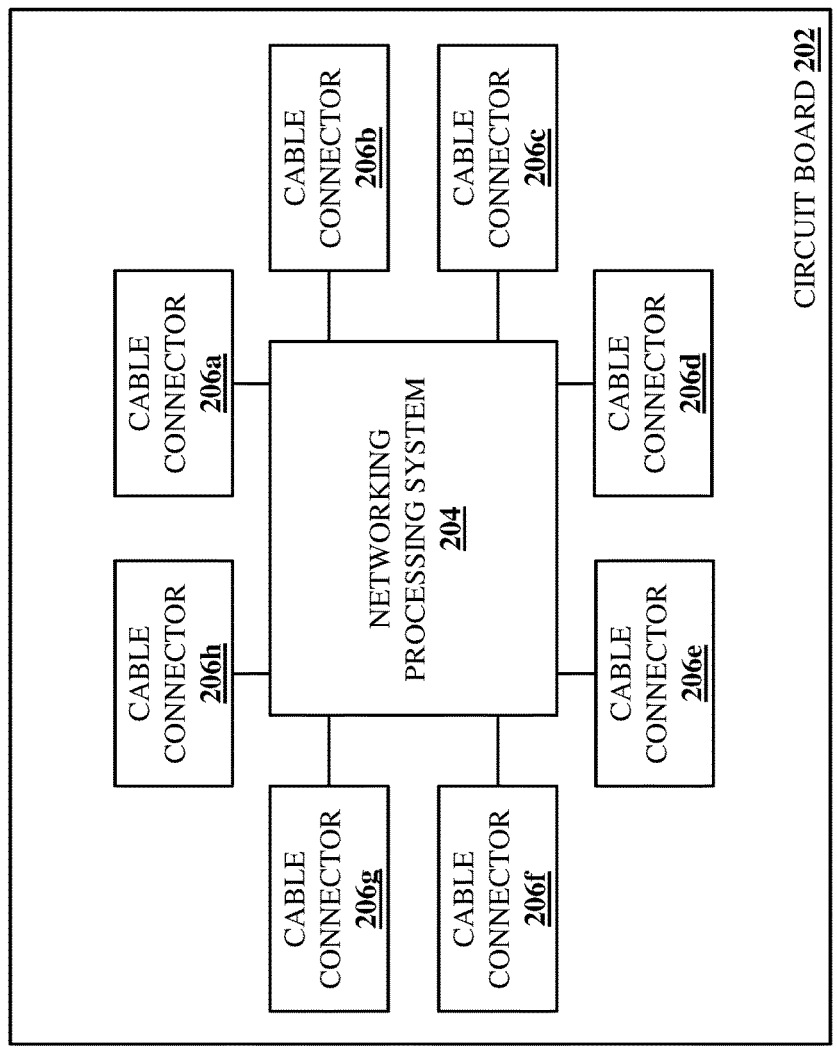
FIG. 2 is a schematic view illustrating an embodiment of a networking circuit board that may be utilized in the high-speed networking device manufacturing system of the present disclosure.

Referring now to FIG. 2, an embodiment of a networking circuit board 200 is illustrated that may be utilized in the high-speed networking device manufacturing system of the present disclosure. As discussed below, the networking circuit board 200 includes a networking circuit board configuration that enables any of the plurality of different networking devices discussed below to be configured with their corresponding networking device functionality discussed below, and that one of skill in the art in possession of the present disclosure will appreciate may enable other networking devices to be configured with a variety of other networking device functionality that is not explicitly described herein. In the illustrated embodiment, the networking circuit board 200 includes a circuit board 202 that may be provided by a motherboard, other Printed Circuit Boards (PCBs), and other any other board that one of skill in the art in possession of the present disclosure would recognize as capable of supporting the components and component connections described below. In the illustrated embodiment, a networking processing system 204 is mounted to the circuit board 202. In a specific example, the networking processing system 204 may be provided by a Network Processing Unit (NPU) such as a 102.4T NPU that includes 1024 100G or 522 200G SerDes connections. However, while a specific NPU bandwidth is described herein, one of skill in the art in possession of the present disclosure will appreciate how networking processing systems with other NPU bandwidths will fall within the scope of the present disclosure as well.

In the illustrated embodiment, a plurality of cable connectors 206a, 206b, 206c, 206d, 206e, 206f, 206g, and 206h are mounted to the circuit board 202 and coupled to the networking processing system 204 via the circuit board 202. For example, one of skill in the art in possession of the present disclosure will appreciate how the networking processing system 204 may include pins or other couplings that are configured to couple to the cable connectors 206a-206h via, for example, traces on the circuit board 202. However, while a specific networking processing system/cable connector coupling technique has been described, one of skill in the art in possession of the present disclosure will appreciate how the cable connectors 206a-206h may be coupled to the networking processing system 204 in a variety of manners that will fall within the scope of the present disclosure as well.

As discussed below, each of the cable connectors may be provided by a high-speed cable connector that is configured to connect to a high-speed cable in order to, for example, couple the networking processing system 204 to a networking subsystem in a chassis that is also connected to that high-speed cable. For example, the cable connectors 206a-206h may be provided by FLYOVER® cable connectors available from SAMTEC® of New Albany, Indiana, United States. However, while particular cable connectors are described, one of skill in the art in possession of the present disclosure will appreciate how other cable connectors may be provided while remaining within the scope of the present disclosure as well. Furthermore, while a specific networking circuit board 200 has been illustrated and described, one of skill in the art in possession of the present disclosure will recognize that the high-speed networking device manufacturing system of the present disclosure may utilize networking circuit boards with networking circuit board configurations including a variety of components and/or component configurations while remaining within the scope of the present disclosure as well.

Figure 3A:
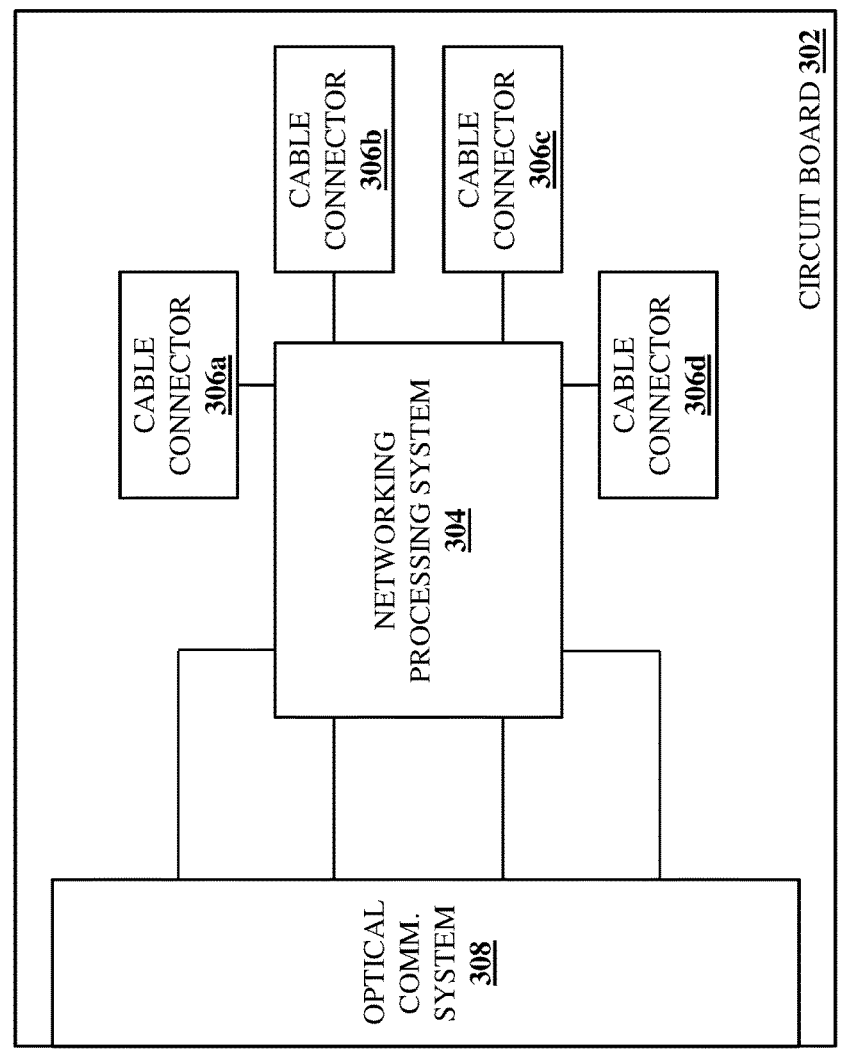
FIG. 3A is a schematic top view illustrating an embodiment of a networking circuit board that may be utilized in the high-speed networking device manufacturing system of the present disclosure.

For example, FIG. 3A illustrates an embodiment of a networking circuit board 300 that may be utilized in the high-speed networking device manufacturing system of the present disclosure. As discussed below, the networking circuit board 300 includes a networking circuit board configuration that enables some of the plurality of different networking devices discussed below to be configured with their corresponding networking device functionality discussed below, and that one of skill in the art in possession of the present disclosure will appreciate may enable other networking devices to be configured with a variety of other networking device functionality that is not explicitly described below. Furthermore, the networking circuit board configuration of the networking circuit board 300 provides an example of a networking circuit board configuration and corresponding networking circuit board functionality that may be reproduced by the networking circuit board 200 discussed above with reference to FIG. 2, but that may be manufactured at a lower cost than the networking circuit board 200 (e.g., due to the elimination of a subset of the relatively expensive cable connectors 206e-206h discussed above with reference to FIG. 2). As such, one of skill in the art in possession of the present disclosure will appreciate how networking circuit boards provided according to the teachings of the present disclosure may be provided with a relatively less versatile networking circuit board configuration (e.g., a networking circuit board configuration that is not capable of satisfying all networking device utilization scenarios) when doing so is justified due to, for example, the number of networking device utilization scenarios for that relatively less versatile networking circuit board configuration allowing the developmental costs of that networking circuit board configuration to be recouped and a threshold profit to be achieved.

In the illustrated embodiment, the networking circuit board 300 includes a circuit board 302 that may be provided by a motherboard, other PCBs, and other any other board that one of skill in the art in possession of the present disclosure would recognize as capable of supporting the components and component connections described below. In the illustrated embodiment, a networking processing system 304 is mounted to the circuit board 302. Similarly as discussed above, the networking processing system 304 may be provided by an NPU such as such as a 102.4T NPU that includes 1024 100G or 522 200G SerDes connections. However, while a specific NPU bandwidth is described herein, one of skill in the art in possession of the present disclosure will appreciate how networking processing systems with other NPU bandwidths will fall within the scope of the present disclosure as well.

In the illustrated embodiment, a plurality of cable connectors 306a, 306b, 306c, and 306d are mounted to the circuit board 302 and coupled to the networking processing system 304 via the circuit board 302. For example, one of skill in the art in possession of the present disclosure will appreciate how the networking processing system 304 may include pins or other couplings that are configured to couple to the cable connectors 306a-306d via, for example, traces on the circuit board 302. However, while a specific networking processing system/cable connector coupling technique has been described, one of skill in the art in possession of the present disclosure will appreciate how the cable connectors 306a-306d may be coupled to the networking processing system 304 in a variety of manners that will fall within the scope of the present disclosure as well.

Similarly as discussed below, each of the cable connectors may be provided by a high-speed cable connector that is configured to connect to a high-speed cable in order to, for example, couple the networking processing system 304 to a networking subsystem in a chassis that is also connected to that high-speed cable. For example, the cable connectors 306a-306d may be provide by FLYOVER® cable connectors provided by SAMTEC® of New Albany, Indiana, United States. However, while particular cable connectors are described, one of skill in the art in possession of the present disclosure will appreciate how other cable connectors may be provided while remaining within the scope of the present disclosure as well.

In the illustrated embodiment, an optical communication system 308 is mounted to the circuit board 302 and coupled to the networking processing system 304 via the circuit board 302. In the examples provided below, the optical communication system 308 is described as including a single row of optical data ports that are configured to couple the networking processing system 304 to other devices, but one of skill in the art in possession of the present disclosure will appreciate how other device coupling systems will fall within the scope of the present disclosure as well. As discussed above, one of skill in the art in possession of the present disclosure will appreciate how the networking processing system 304 may include pins or other couplings that are configured to couple to the optical communication system 308 via, for example, traces on the circuit board 302. However, while a specific networking processing system/optical communication system coupling technique has been described, one of skill in the art in possession of the present disclosure will appreciate how the optical communication system 308 may be coupled to the networking processing system 304 in a variety of manners that will fall within the scope of the present disclosure as well.

With reference to FIG. 3B, an embodiment of the optical communication system 308 is illustrated that includes a single row 308a of optical data ports, and while the specific example in FIG. 3B illustrates a row with 16 optical data ports, one of skill in the art in possession of the present disclosure will appreciate how fewer (e.g., 8 optical data ports) or more (e.g., 32 optical data ports, 64 optical data ports, etc.) optical data ports may be provided on the optical communication system 308 while remaining within the scope of the present disclosure as well. As discussed below, various embodiments of the present disclosure may utilize an optical communication system with a single row of optical data ports (i.e., similar to that illustrated in FIG. 3B) when providing a 1 Rack Unit (1RU) networking device. However, while a single row of optical data ports 308a are illustrated in FIG. 3B, one of skill in the art in possession of the present disclosure will appreciated how more rows of optical data ports may be provided on the optical communication system 308 while remaining within the scope of the present disclosure as well.

While various specific embodiments of the networking circuit board 300 have been illustrated and described, one of skill in the art in possession of the present disclosure will recognize that the high-speed networking device manufacturing system of the present disclosure may utilize networking circuit boards having networking circuit board configurations with other components and/or component configurations while remaining within the scope of the present disclosure as well. For example, one of skill in the art in possession of the present disclosure will appreciate how the techniques described herein may be utilized to provide a computing device manufacturing system that utilizes computing circuit boards in a manner similar to the networking circuit boards discussed below in order to manufacture a variety of different computing devices similarly as described for the different networking devices discussed below.

Figure 4:
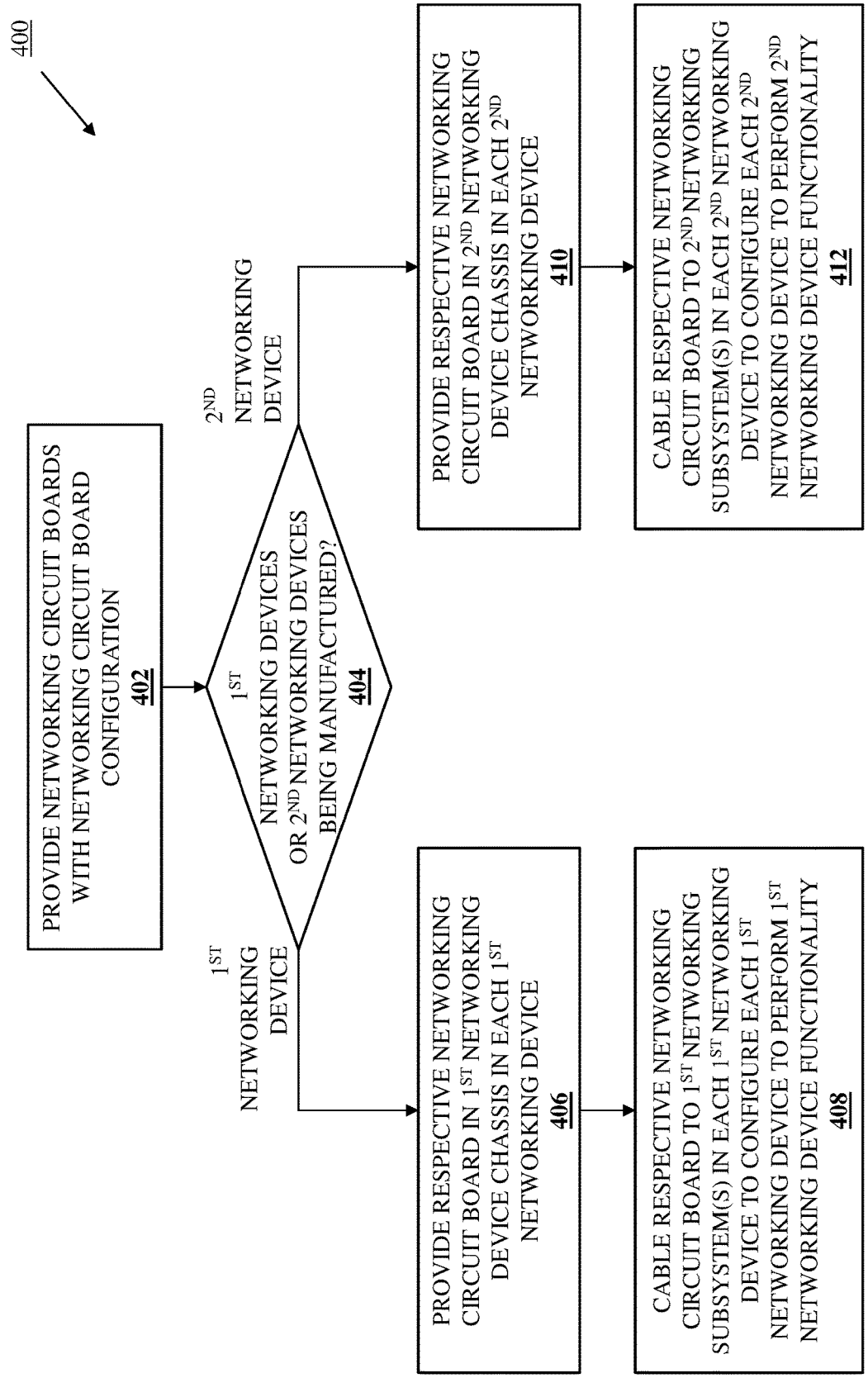
FIG. 4 is a flow chart illustrating an embodiment of a method for manufacturing networking devices.

Referring now to FIG. 4, an embodiment of a method 400 for manufacturing networking devices is illustrated. As discussed below, the systems and methods of the present disclosure provide a plurality of networking circuit boards having a common networking circuit board configuration that allows a plurality of different networking device functionality to be configured for different networking devices, thus allowing the "same" networking circuit board (e.g., different physical networking circuit boards all with the same networking circuit board configuration) to be utilized to manufacture different types of networking devices (e.g., a 1RU networking device, a 2RU networking device, a disaggregated networking device, a modular line card, a modular fabric card, and/or any other networking devices that would be apparent to one of skill in the art in possession of the present disclosure). For example, the method for manufacturing networking devices of the present disclosure may include providing circuit boards each having an NPU mounted to that circuit board, and respective cable connectors mounted to that circuit board and coupled to that NPU. First networking devices are manufactured by providing one of the circuit boards in a chassis in each first networking device, and cabling at least some of the cable connectors on that circuit board to first subsystem(s) in that first networking device in order to configure that first networking device to perform first functionality. Second networking devices are manufactured by providing a respective one of the circuit boards in a chassis in each second networking device, and cabling at least some of the cable connectors on that circuit board to second subsystem(s) in that second networking device in order to configure that second networking device to perform second functionality that is different than the first functionality. As such, the costs of developing and manufacturing different types of networking devices with different networking device functionality is reduced, thus allowing a variety of different types of networking devices that are optimized for different networking device utilization scenarios to be developed and manufactured.

The method 400 begins at block 402 where networking circuit boards with networking circuit board configuration are provided. In an embodiment, at block 402, a plurality of the networking circuit board 200 discussed above with reference to FIG. 2 are provided, and while the specific examples below primarily describe the use of the networking circuit board 200 to manufacture the networking devices described below, several examples are provided below of how the networking circuit board 300 may alternatively be provided and utilized to manufacture at least some of the networking devices described below while remaining within the scope of the present disclosure as well. As will be appreciated by one of skill in the art in possession of the present disclosure, the provisioning of the networking circuit board 200 at block 402 may include the performance of any of a variety of design, testing, validation, and/or other networking circuit board development techniques that would be apparent to one of skill in the art in possession of the present disclosure. In a specific example, the provisioning of the networking circuit board 200 may include developing the networking circuit board to satisfy any of the relatively high-speed data transmission networking device utilization scenarios discussed herein, but one of skill in the art in possession of the present disclosure will appreciate how networking circuit boards may be developed to satisfy any of a variety of networking device utilization scenarios while remaining within the scope of the present disclosure as well.

The method 400 then proceeds to decision block 404 where the method 400 proceeds depending on whether first networking devices or second networking devices are being manufactured. As described herein, the networking circuit board 200 may be utilized to manufacture different networking devices having different networking device functionality, which one of skill in the art in possession of the present disclosure will appreciate may include different "families" of networking devices (e.g., switch devices, I/O modules, etc.) that are optimized for different networking device utilization scenarios (e.g., 1RU networking device rack scenarios, 2RU networking device rack scenarios, intra-chassis server/storage networking device scenarios, line card/fabric card modular chassis scenarios, etc.). Furthermore, while only two types or "families" of networking devices (e.g., "first" networking devices having "first" networking device functionality and "second" networking devices having " " networking device functionality that is different than the "first" networking device functionality) are illustrated and described as being manufactured in the example of the method 400 discussed below, one of skill in the art in possession of the present disclosure will appreciated how other types or "families" of networking devices (e.g., "third" networking devices having "third" networking device functionality that is different than the "first" and "second" networking device functionality, and so on) may be manufactured according to the method 400 while remaining within the scope of the present disclosure as well.

As such, at decision block 404, the method 400 may proceed to manufacture the first networking devices having the first networking device functionality using the networking circuit board 200, or may proceed to manufacture the second networking devices having the second networking device functionality using the networking circuit board 200, and one of skill in the art in possession of the present disclosure will appreciate how the networking circuit boards 200 may be utilized to concurrently manufacture both the first networking devices and the second networking devices described below while remaining within the scope of the present disclosure as well. The discussion of the remaining blocks of the method 400 below describes the manufacture of the first networking devices and the second networking device using the networking circuit board 200 generally, followed by several examples of the networking circuit board 200 included in networking devices chassis and cabled to configure the corresponding networking devices with different networking device functionality, and one of skill in the art in possession of the present disclosure will appreciate that any two of those examples of networking devices with different networking device functionality (or other networking devices with other networking device functionality not explicitly described below) may provide the first networking devices and second networking devices, respectively, manufactured according to the method 400 while remaining within the scope of the present disclosure.

If, at decision block 404, first networking devices are being manufactured, the method 400 proceeds to block 406 where a respective networking circuit board is provided in a first networking device chassis in each first networking device. In an embodiment, at block 406 and in situations in which first networking devices are being manufactured, a respective networking circuit board 200 may be provided in each of a plurality of first networking device chassis. For example, first networking device chassis may be provided at a networking device manufacturer location, and a respective one of the networking circuit board 200 may be mounted in, connected to, or otherwise provided in each of those first networking device chassis. As such, one of skill in the art in possession of the present disclosure will appreciated how a networking device manufacturing facility may provide a plurality of the networking circuit boards 200 and a plurality of first networking device chassis, and a networking device manufacturing "line" (e.g., an assembly line for assembling or otherwise manufacturing the first networking device) may provide for the provisioning of a respective one of those networking circuit boards 200 in each of those first networking device chassis. However, while a specific networking device manufacturing technique is described, one of skill in the art in possession of the present disclosure will appreciate how other manufacturing techniques for manufacturing the first networking devices may be utilized while remaining within the scope of the present disclosure as well.

The method 400 then proceeds to block 408 where the respective networking circuit board is cabled to first networking subsystem(s) in each first networking device to configure each first networking device to perform first networking device functionality. In an embodiment, at block 408, the networking circuit board 200 provided in each first networking device chassis at block 406 is cabled to one or more first networking subsystems in the first networking device chassis in order to configure each of those first networking devices to perform the same first networking device functionality. As discussed below, any or all of the cable connectors 206a-206h on each networking circuit board 200 in a corresponding first networking device chassis may be cabled at block 408 to first networking subsystem(s) that are included in that first networking device chassis in order to provide each of those first networking devices with the same first networking device functionality, and one of skill in the art in possession of the present disclosure will recognize that the specific examples provided below are just a few of the possible cabling options/networking device configurations that may be enabled via the networking circuit board 200.

If, at decision block 404, second networking devices are being manufactured, the method 400 proceeds to block 410 where a respective networking circuit board is provided in a second networking device chassis in each second networking device. In an embodiment, at block 410, and in situations in which second networking devices are being manufactured, a respective networking circuit board 200 may be provided in each of a plurality of second networking device chassis. For example, second networking device chassis may be provided at a networking device manufacturer location, and a respective one of the networking circuit board 200 may be mounted in, connected to, or otherwise provided in each of those second networking device chassis. As such, one of skill in the art in possession of the present disclosure will appreciated how a networking device manufacturing facility may provide a plurality of the networking circuit boards 200 and a plurality of second networking device chassis, and a networking device manufacturing "line" (e.g., an assembly line for assembling or otherwise manufacturing the second networking device) may provide for the provisioning of a respective one of those networking circuit boards 200 in each of those second networking device chassis. However, while a specific networking device manufacturing technique is described, one of skill in the art in possession of the present disclosure will appreciate how other manufacturing techniques for manufacturing the second networking devices may be utilized while remaining within the scope of the present disclosure as well.

The method 400 then proceeds to block 412 where the respective networking circuit board is cabled to second networking subsystem(s) in each second networking device to configure each second networking device to perform second networking device functionality. In an embodiment, at block 412, the networking circuit board 200 provided in each second networking device chassis at block 410 is cabled to one or more second networking subsystems in the second networking device chassis in order to configure each of those second networking devices to perform the same second networking device functionality. As discussed below, any or all of the cable connectors 206a-206h on each networking circuit board 200 in a corresponding second networking device chassis may be cabled at block 412 to second networking subsystem(s) that are included in that second networking device chassis in order to provide each of those second networking devices with the same second networking device functionality, and one of skill in the art in possession of the present disclosure will recognize that the specific examples provided below are just a few of the possible cabling options/networking device configurations that may be enabled via the networking circuit board 200.

Figure 5A:
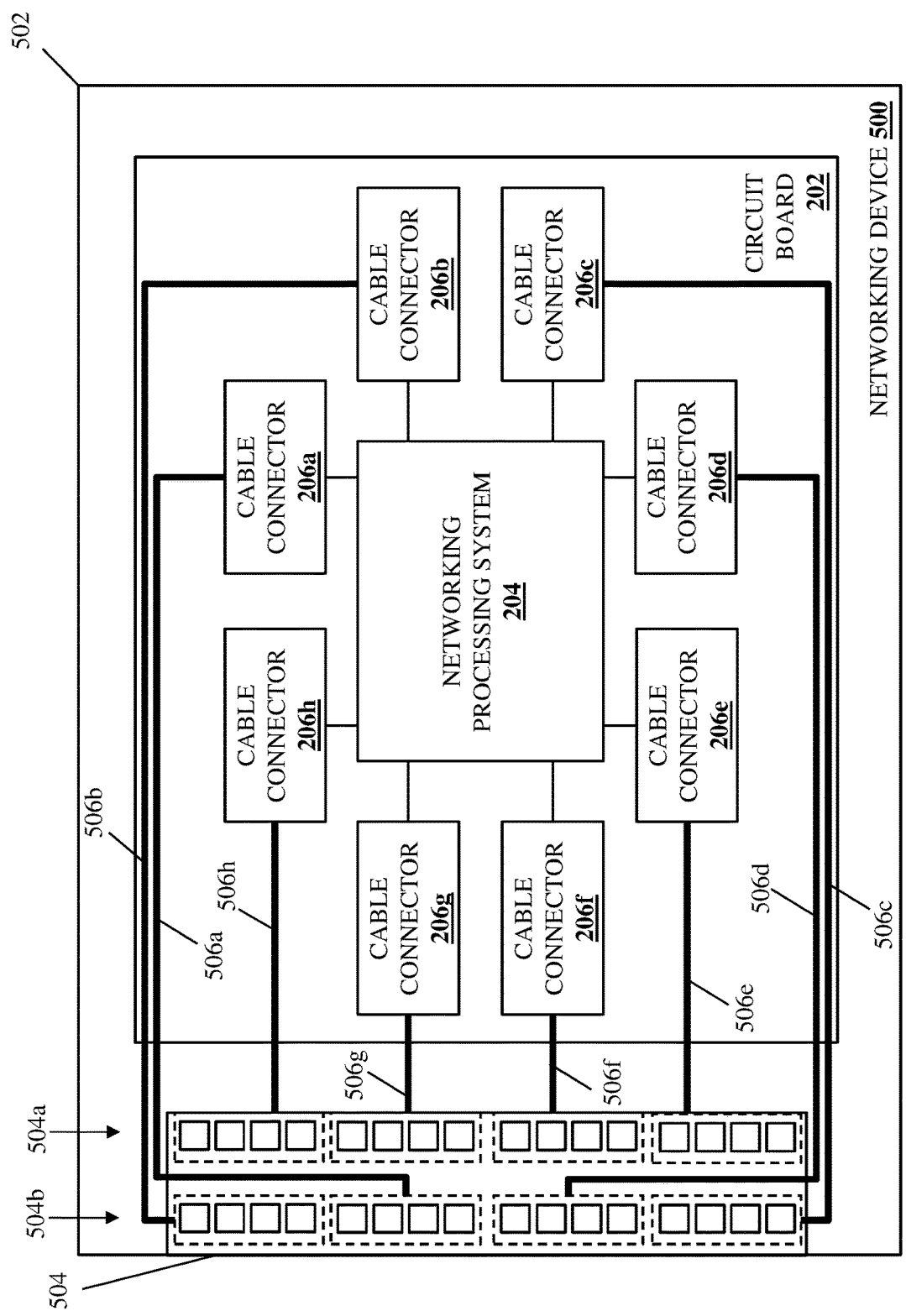
FIG. 5A is a schematic view illustrating an embodiment of a networking device that may be manufactured according to the method of FIG. 4 using the networking circuit board of FIG. 2.
Figure 5B:
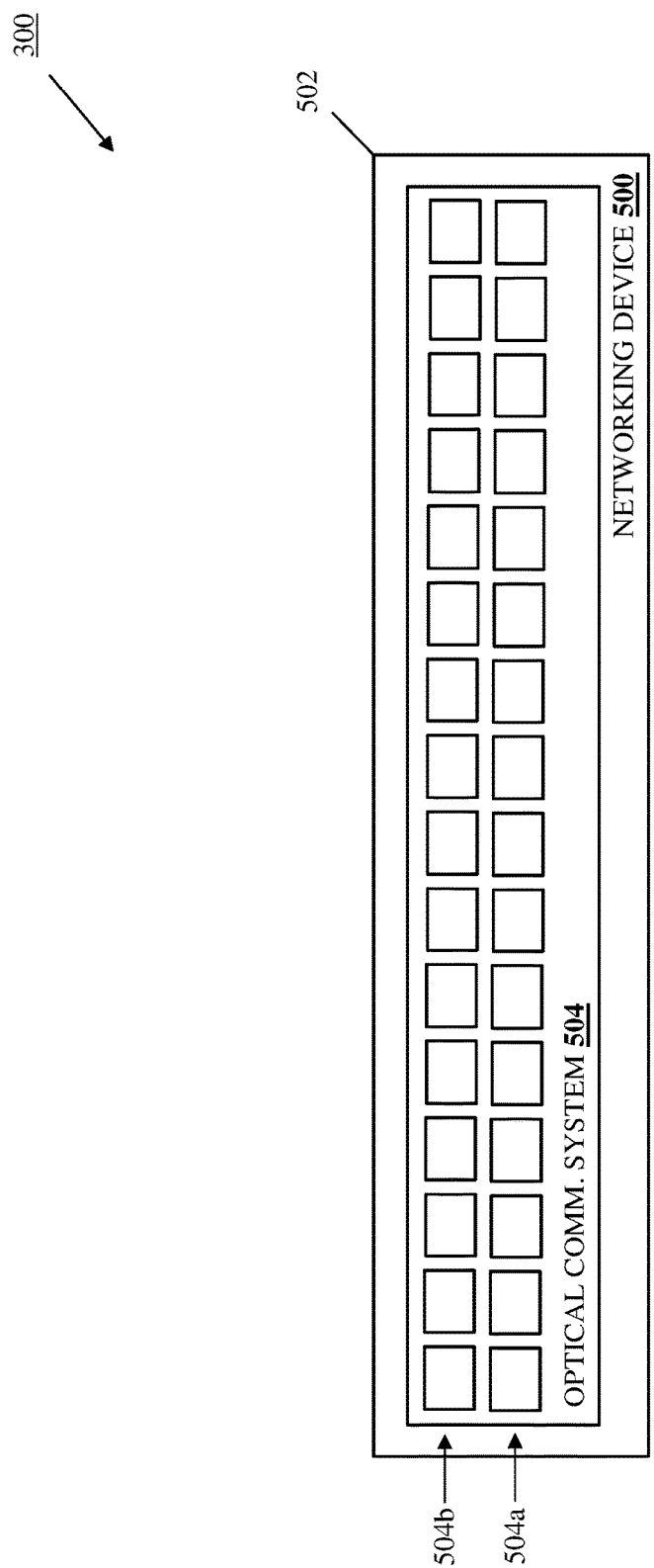
FIG. 5B is a schematic front view illustrating an embodiment of the networking device of FIG. 5A.

With reference to FIGS. 5A and 5B, an embodiment of a networking device 500 is illustrated that may be provided as any of the plurality of first networking devices manufactured according to blocks 406 and 408 of the method 400, or provided as any of the plurality of second networking devices manufactured according to blocks 410 and 412 of the method 400. In the illustrated embodiment, the networking device 500 includes a networking device chassis 502, and the networking circuit board 200 is located in the networking device chassis 502 (e.g., after having been provided in the networking device chassis 502 at block 406 or block 410 of the method 400). Furthermore, a networking subsystem that is included in the networking device chassis 502 is provided by an optical communication system 504 that may be similar to the optical communication system 308 discussed above with reference to FIG. 3A, but that is not mounted to the circuit board 202 on the networking circuit board 200, and rather is mounted to, connected, or otherwise coupled to the networking device chassis 502.

In the illustrated example, the optical communication system 504 includes a first row 504a of optical data ports and a second row 504b of optical data ports. For example, the first row 504a of optical data ports may be a "lower" row of optical data ports, and the second row 504b of optical data ports may be an "upper" row of optical data ports, all of which may be accessible on an outer surface of the networking device chassis 502. In the illustrated embodiment, each of the cable connectors 206a-206h may be cabled to the optical communication system 504 via a respective high-speed cable that may be provided by FLYOVER® cable available from SAMTEC® of New Albany, Indiana, United States. However, while particular cables are described, one of skill in the art in possession of the present disclosure will appreciate how other cables may be used to cable the networking circuit board 200 to the optical communication system 504 while remaining within the scope of the present disclosure as well.

In the specific example illustrated in FIGS. 5A and 5B, the cable connector 206a is cabled to the optical communication system 504 via a cable 506a that couples the cable connector 206a to a first subset of the second row 504b of optical data ports (e.g., four optical data ports in the illustrated embodiment), the cable connector 206b is cabled to the optical communication system 504 via a cable 506b that couples the cable connector 206b to a second subset of the second row 504b of optical data ports (e.g., four optical data ports in the illustrated embodiment), the cable connector 206c is cabled to the optical communication system 504 via a cable 506c that couples the cable connector 206c to a third subset of the second row 504b of optical data ports (e.g., four optical data ports in the illustrated embodiment), and the cable connector 206d is cabled to the optical communication system 504 via a cable 506d that couples the cable connector 206d to a fourth subset of the second row 504b of optical data ports (e.g., four optical data ports in the illustrated embodiment). However, while each of the cable connectors 206a, 206b, 206c, and 206d are illustrated as being cabled to a respective subset of four optical data ports in the second row 504b of optical data ports in the optical communication system 504, one of skill in the art in possession of the present disclosure will appreciate how cable connectors may be connected to different numbers of optical data ports while remaining within the scope of the present disclosure as well.

Similarly, the cable connector 206e is cabled to the optical communication system 504 via a cable 506e that couples the cable connector 206e to a first subset of the first row 504a of optical data ports (e.g., four optical data ports in the illustrated embodiment), the cable connector 206f is cabled to the optical communication system 504 via a cable 506f that couples the cable connector 206f to a second subset of the first row 504a of optical data ports (e.g., four optical data ports in the illustrated embodiment), the cable connector 206g is cabled to the optical communication system 504 via a cable 506g that couples the cable connector 206g to a third subset of the first row 504a of optical data ports (e.g., four optical data ports in the illustrated embodiment), and the cable connector 206h is cabled to the optical communication system 504 via a cable 506h that couples the cable connector 206h to a fourth subset of the first row 504a of optical data ports (e.g., four optical data ports in the illustrated embodiment). However, while each of the cable connectors 206e, 206f, 206g, and 206h are illustrated as being cabled to a respective subset of four optical data ports in the first row 504a of optical data ports in the optical communication system 504, one of skill in the art in possession of the present disclosure will appreciate how cable connectors may be connected to different numbers of optical data ports while remaining within the scope of the present disclosure as well.

As will be appreciated by one of skill in the art in possession of the present disclosure, the specific example of the cabling of the cable connectors 206a-206h to the optical communication system 504 in FIG. 5A may provide the networking device 500 as a "2RU fixed port" switch device that is configured to perform optical data exchange functionality that includes transmitting and receiving optical data via optical data port(s) in the first row 504a and/or second row 504b of optical data ports in the optical communication system 504. As such, the networking device 500 may be optimized for networking device utilization scenarios that include a rack having a 2RU space for the networking device 500, and that houses a plurality of server device(s) and/or storage device(s) that require connection to the optical data ports in the optical communication system 504 in order to communicate with each other, outside that rack, via a network, and/or in other manners that one of skill in the art in possession of the present disclosure will recognize as being enabled by the networking device 500 as configured in FIGS. 5A and 5B.

Figure 6A:
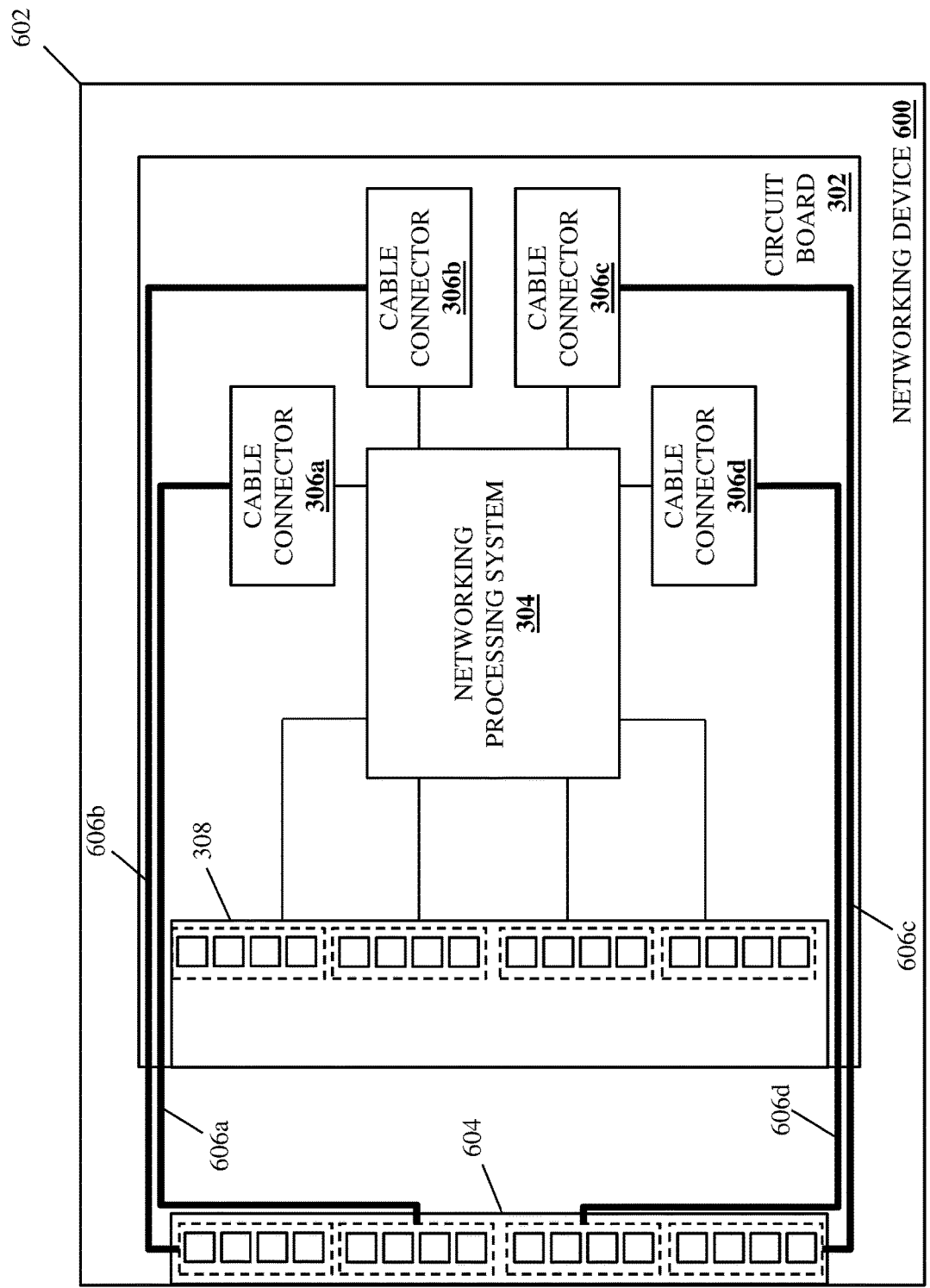
FIG. 6A is a schematic view illustrating an embodiment of a networking device that may be manufactured according to the method of FIG. 4 using the networking circuit board of FIG. 3.
Figure 6B:
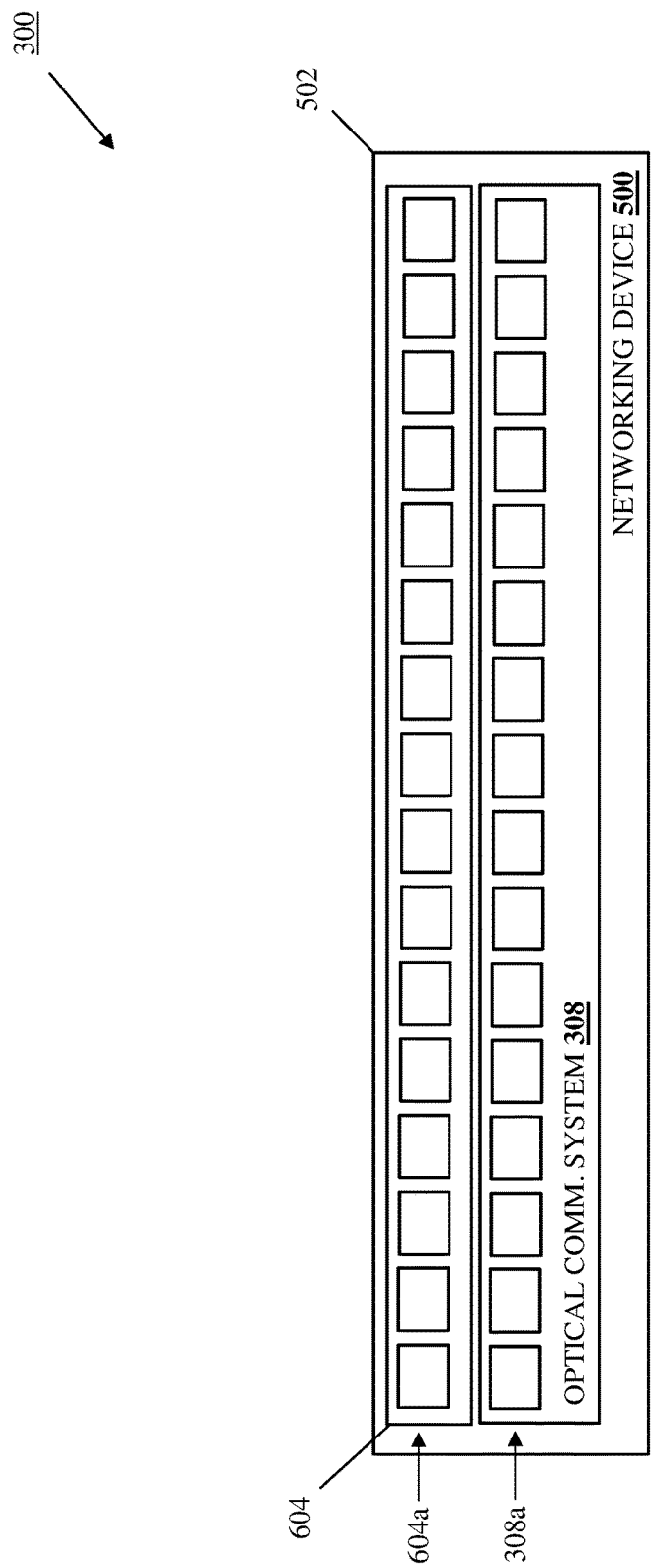
FIG. 6B is a schematic front view illustrating an embodiment of the networking device of FIG. 6A.

As will be appreciated by one of skill in the art in possession of the present disclosure, the networking circuit board 300 described above with reference to FIGS. 3A and 3B may be utilized to manufacture networking devices with networking device functionality similar to that described above for the networking device 500. With reference to FIGS. 6A and 6B, a networking device 600 is illustrated that includes a networking device chassis 602, and the networking circuit board 300 is located in the networking device chassis 602 (e.g., after having been provided in the networking device chassis 602 at block 406 or block 410 of the method 400). Furthermore, a networking subsystem that is included in the networking device chassis 602 is provided by an optical communication system 604 that may be similar to the optical communication system 308 discussed above with reference to FIG. 3A, but that is not mounted to the circuit board 302 on the networking circuit board 300, and rather is mounted to, connected, or otherwise coupled to the networking device chassis 602.

In the illustrated example, the optical communication system 308 mounted to the circuit board 302 provides a first row 308a of optical data ports, and the optical communication system 604 mounted to the networking device chassis 602 provides a second row 604a of optical data ports. For example, the first row 308a of optical data ports may be a "lower" row of optical data ports on the networking device 600, and the second row 604a of optical data ports may be an "upper" row of optical data ports on the networking device 600, all of which may be accessible on an outer surface of the networking device chassis 602. In the illustrated embodiment, each of the cable connectors 306a-306d may be cabled to the optical communication system 604 via a respective high-speed cable that may be provided by FLYOVER® cable available from SAMTEC® of New Albany, Indiana, United States. However, while particular cables are described, one of skill in the art in possession of the present disclosure will appreciate how other cables may be used to cable the networking circuit board 300 to the optical communication system 604 while remaining within the scope of the present disclosure as well.

In the specific example illustrated in FIGS. 6A and 6B, the cable connector 306a is cabled to the optical communication system 504 via a cable 606a that couples the cable connector 306a to a first subset of the second row 604a of optical data ports (e.g., four optical data ports in the illustrated embodiment), the cable connector 306b is cabled to the optical communication system 304 via a cable 606b that couples the cable connector 306b to a second subset of the second row 604a of optical data ports (e.g., four optical data ports in the illustrated embodiment), the cable connector 306c is cabled to the optical communication system 604 via a cable 606c that couples the cable connector 306c to a third subset of the second row 604a of optical data ports (e.g., four optical data ports in the illustrated embodiment), and the cable connector 306d is cabled to the optical communication system 604 via a cable 606d that couples the cable connector 306d to a fourth subset of the second row 604a of optical data ports (e.g., four optical data ports in the illustrated embodiment). However, while each of the cable connectors 306a, 306b, 306c, and 306d are illustrated as being cabled to a respective subset of four optical data ports in the second row 604a of optical data ports in the optical communication system 604, one of skill in the art in possession of the present disclosure will appreciate how cable connectors may be connected to different numbers of optical data ports while remaining within the scope of the present disclosure as well.

One of skill in the art in possession of the present disclosure will appreciated how the cables 606a-606d may be required for the coupling of the cable connectors 306a-306d to the optical communication system 604 while similar cabling may not be required for the coupling of the optical communication system 308 to the networking processing system 304 due to the relative distances between the networking processing system 304 and those optical communications systems 308 and 604. For example, the relatively short distances between the networking processing system 304 and the optical communication system 308 may allow the traces in the circuit board 302 to couple of the networking processing system 304 to the optical communication system 308 due to their ability to transmit relatively high-speed signals with less than a threshold level of signal degradation, while the relatively large distances between the networking processing system 304 and the optical communication system 604 may require the cables 606a-606d to couple the networking processing system 304 to the optical communication system 604 due to the inability of circuit board traces to transmit relatively high-speed signals that distance with less than the threshold level of signal degradation.

As will be appreciated by one of skill in the art in possession of the present disclosure, the specific example of the optical communication system 308 and the cabling of the cable connectors 306a-306d to the optical communication system 604 may provide the networking device 600 as a "2RU fixed port" switch device that is configured to perform optical data exchange functionality that includes transmitting and receiving optical data via optical data port(s) in the first row 308a of optical data ports in the optical communication system 308 and/or second row 604a of optical data ports in the optical communication system 604. As such, the networking device 600 may be optimized for networking device utilization scenarios that include a rack having a 2RU space for the networking device 600, and that houses a plurality of server device(s) and/or storage device(s) that require connection to the optical data ports in the optical communication systems 308 and 604 in order to communicate with each other, outside that rack, via a network, and/or in other manners that one of skill in the art in possession of the present disclosure will recognize as being enabled by the networking device 600 as configured in FIGS. 6A and 6B.

Figure 7:
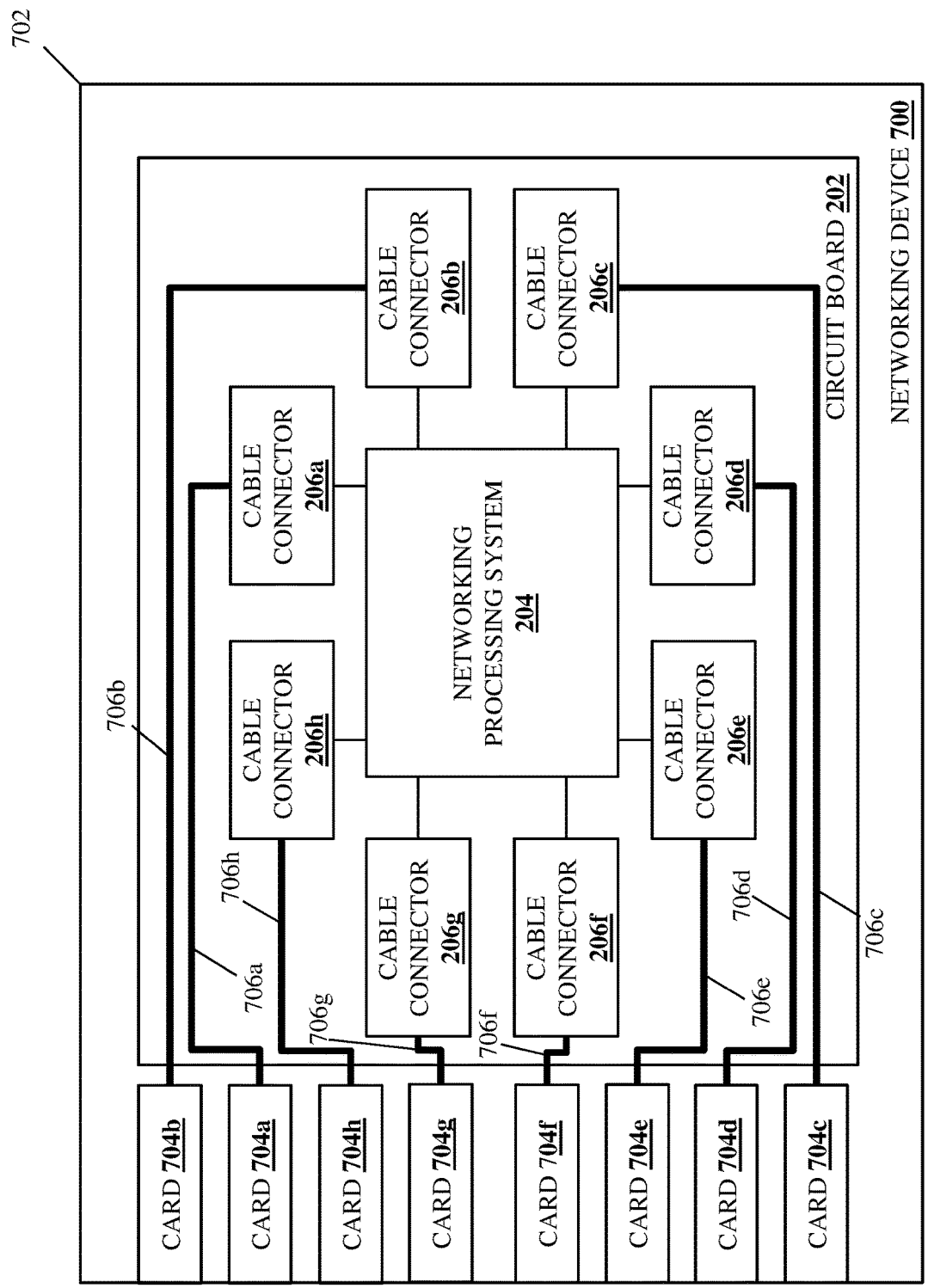
FIG. 7 is a schematic view illustrating an embodiment of a networking device that may be manufactured according to the method of FIG. 4 using the networking circuit board of FIG. 2.

With reference to FIG. 7, an embodiment of a networking device 600 is illustrated that may be provided as any of the plurality of first networking devices manufactured according to blocks 406 and 408 of the method 400, or provided as any of the plurality of second networking devices manufactured according to blocks 410 and 412 of the method 400. In the illustrated embodiment, the networking device 700 includes a networking device chassis 702, and the networking circuit board 200 is located in the networking device chassis 702 (e.g., after having been provided in the networking device chassis 702 at block 406 or block 410 of the method 400). Furthermore, a networking subsystem that is included in the networking device chassis 702 is provided by a plurality of cards 704a, 704b, 704c, 704d, 704e, 704f, 704g, and 704h that, in the specific examples provided below, may each include a plurality of optical data ports similar to the optical communication systems discussed above, and that may each be mounted to, connected, or otherwise coupled to the networking device chassis 702. However, while cards with optical data ports are described herein, one of skill in the art in possession of the present disclosure will recognize that the cards 704a-704h may include any of a variety of card components while remaining within the scope of the present disclosure as well.

In the illustrated embodiment, each of the cable connectors 206a-206h may be cabled to respective cards 704a-704h via a respective high-speed cable that may be provided by FLYOVER® cable available from SAMTEC® of New Albany, Indiana, United States. However, while particular cables are described, one of skill in the art in possession of the present disclosure will appreciate how other cables may be used to cable the networking circuit board 200 to the cards 704a-704h while remaining within the scope of the present disclosure as well. In the specific example illustrated in FIG. 7, the cable connector 206a is cabled to the card 704a via a cable 706a, the cable connector 206b is cabled to the card 704*b* via a cable 706*b*, the cable connector 206*c* is cabled to the card 704*c* via a cable 706*c*, the cable connector 206*d* is cabled to the card 704*d* via a cable 706*d*, the cable connector 206*e* is cabled to the card 704*e* via a cable 706*e*, the cable connector 206*f* is cabled to the card 704*f* via a cable 706*f*, the cable connector 206*g* is cabled to the card 704*g* via a cable 706*g*, and the cable connector 206*h* is cabled to the card 704*h* via a cable 706*h*.

As will be appreciated by one of skill in the art in possession of the present disclosure, the specific example of the cabling of the cable connectors 206*a*-206*h* to the cards 704*a*-704*h* may provide the networking device 700 as a "modular" switch device that may be configured to perform optical data exchange functionality that includes transmitting and receiving optical data via optical data port(s) on the cards 704*a*-704*h*. As such, the networking device 700 may be optimized for networking device utilization scenarios that require the ability to add/remove optical data ports (or other card components) to the switch device in order to provide any of a variety of switch connectivity that would be apparent to one of skill in the art in possession of the present disclosure.

Figure 8A:
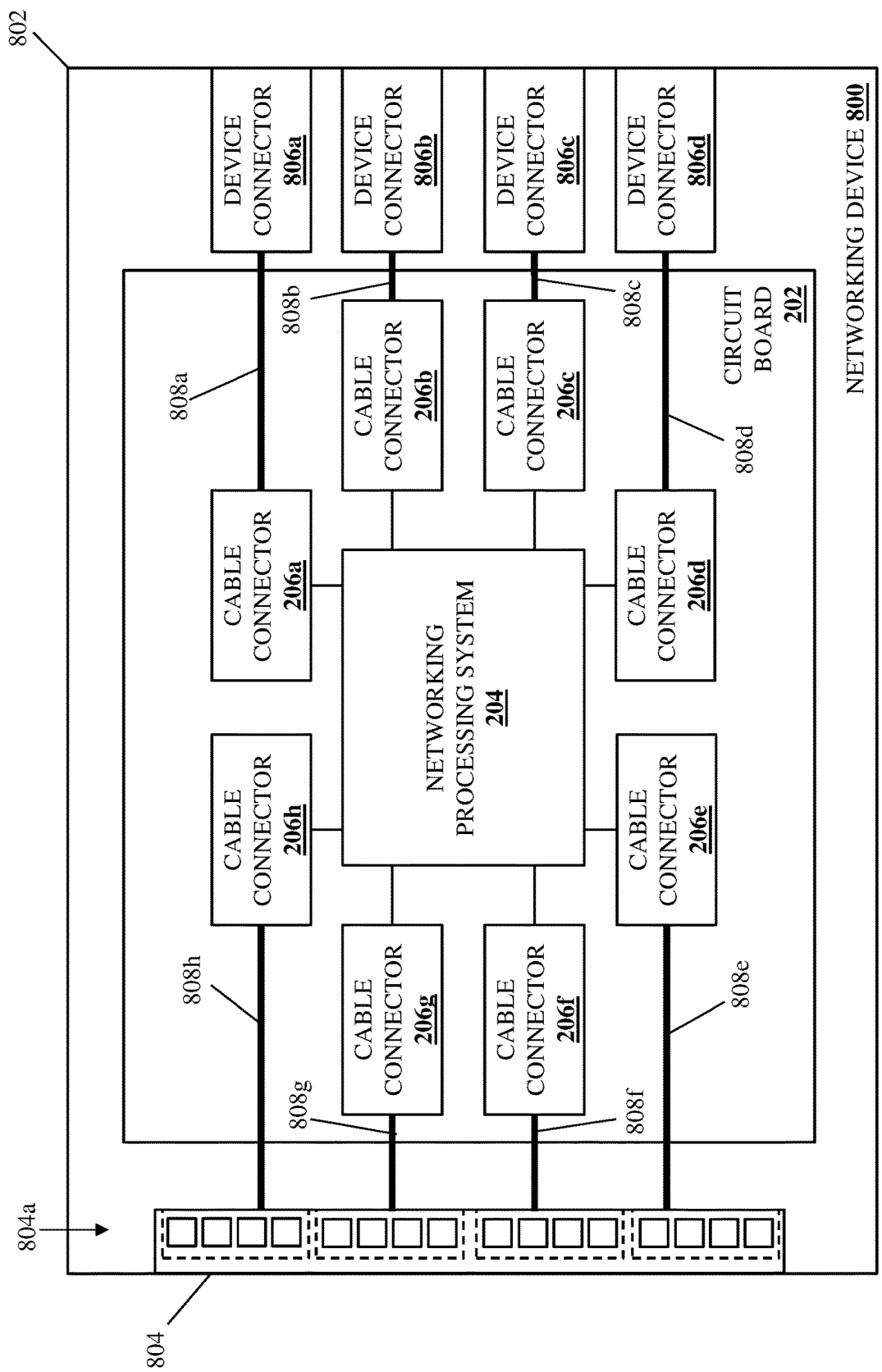
FIG. 8A is a schematic view illustrating an embodiment of a networking device that may be manufactured according to the method of FIG. 4 using the networking circuit board of FIG. 2.
Figure 8B:
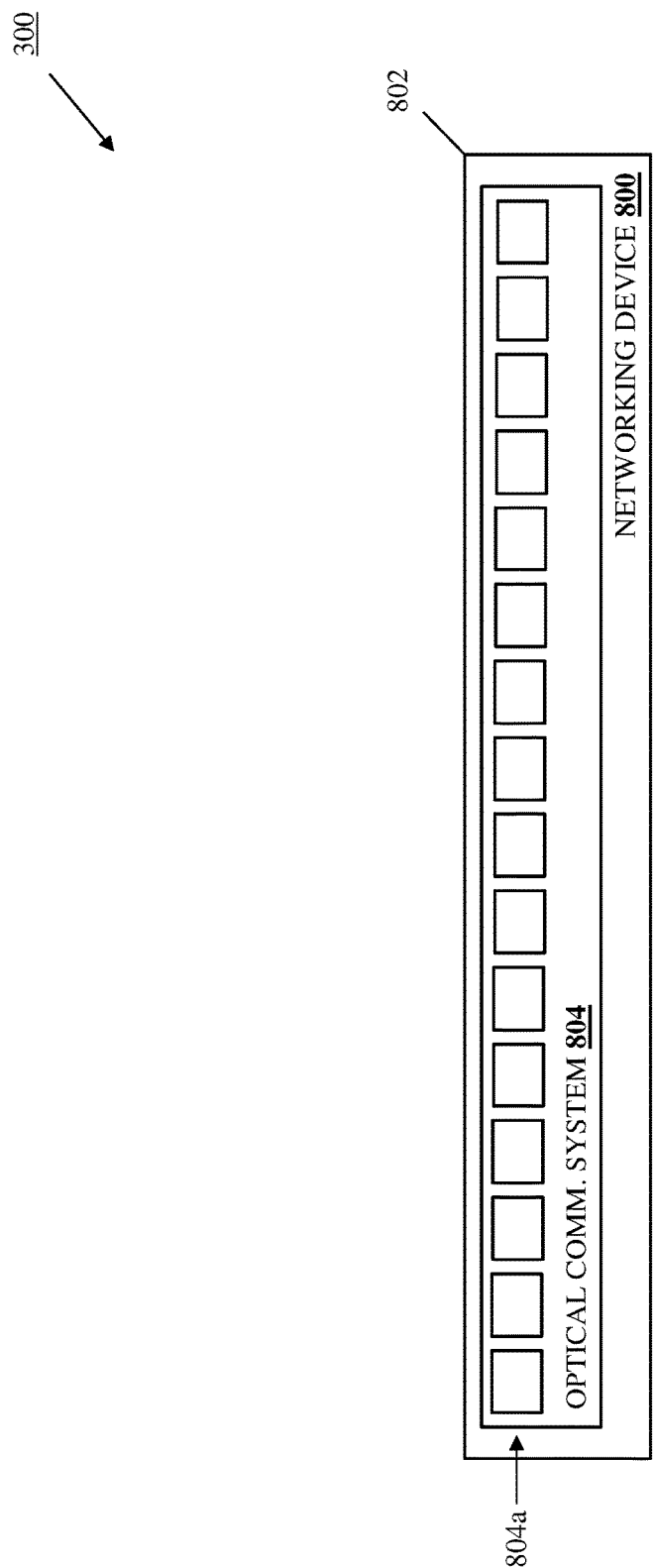
FIG. 8B is a schematic front view illustrating an embodiment of the networking device of FIG. 8A.

With reference to FIGS. 8A and 8B, an embodiment of a networking device 800 is illustrated that may be provided as any of the plurality of first networking devices manufactured according to blocks 406 and 408 of the method 400, or provided as any of the plurality of second networking devices manufactured according to blocks 410 and 412 of the method 400. In the illustrated embodiment, the networking device 800 includes a networking device chassis 802, and the networking circuit board 200 is located in the networking device chassis 802 (e.g., after having been provided in the networking device chassis 802 at block 406 or block 410 of the method 400). Furthermore, a first networking subsystem that is included in the networking device chassis 802 is provided by an optical communication system 804 that may be similar to the optical communication system 308 discussed above with reference to FIG. 3A, but that is not mounted to the circuit board 202 on the networking circuit board 200, and rather is mounted to, connected, or otherwise coupled to the networking device chassis 802. Further still, a second networking subsystem that is included in the networking device chassis 802 is provided by a device connection system that, in the example below, is provided by a plurality of device connectors 806*a*, 806*b*, 806*c*, and 806*d* that are accessible on an outer surface of the networking device chassis 802 and that may each be configured to couple the networking device 800 to another networking device.

In the illustrated example, the optical communication system 804 includes a single row 804*a* of optical data ports that may each be accessible on a front outer surface of the networking device chassis 802, and the device connection system includes a single row of the device connectors 806*a*-806*d* that may each be accessible on a rear outer surface of the networking device chassis 802 that is opposite the networking device chassis 802 from the front outer surface. In the illustrated embodiment, each of the cable connectors 206*a*-206*d* may be cabled to the device connectors 806*a*-806*d*, and each of the cable connectors 206*e*-206*h* may be cabled to the optical communication system 804, via a respective high-speed cable that may be provided by FLYOVER® cable available from SAMTEC® of New Albany, Indiana, United States. However, while particular cables are described, one of skill in the art in possession of the present disclosure will appreciate how other cables may be used to cable the networking circuit board 200 to the device connectors 806*a*-806*d* and the optical communication system 804 while remaining within the scope of the present disclosure as well.

In the specific example illustrated in FIGS. 8A and 8B, the cable connector 206*a* is cabled to the device connector 806*a* via a cable 808*a*, the cable connector 206*b* is cabled to the device connector 806*b* via a cable 808*b*, the cable connector 206*c* is cabled to the device connector 806*c* via a cable 808*c*, and the cable connector 206*d* is cabled to the device connector 806*d* via a cable 808*d*. Similarly, the cable connector 206*e* is cabled to the optical communication system 804 via a cable 808*e* that couples the cable connector 206*e* to a first subset of the row 804*a* of optical data ports (e.g., four optical data ports in the illustrated embodiment), the cable connector 206*f* is cabled to the optical communication system 804 via a cable 808*f* that couples the cable connector 206*f* to a second subset of the row 804*a* of optical data ports (e.g., four optical data ports in the illustrated embodiment), the cable connector 206*g* is cabled to the optical communication system 804 via a cable 808*g* that couples the cable connector 206*g* to a third subset of the row 804*a* of optical data ports (e.g., four optical data ports in the illustrated embodiment), and the cable connector 206*h* is cabled to the optical communication system 804 via a cable 808*h* that couples the cable connector 206*h* to a fourth subset of the row 804*a* of optical data ports (e.g., four optical data ports in the illustrated embodiment). However, while each of the cable connectors 206*e*, 206*f*, 206*g*, and 206*h* are illustrated as being cabled to a respective subset of four optical data ports in the row 804*a* of optical data ports in the optical communication system 804, one of skill in the art in possession of the present disclosure will appreciate how cable connectors may be connected to different numbers of optical data ports while remaining within the scope of the present disclosure as well.

As will be appreciated by one of skill in the art in possession of the present disclosure, the specific example of the cabling of the cable connectors 206*a*-206*h* to the optical communication system 504 may provide the networking device 500 as a "disaggregated 1RU fixed port" switch device with inter-switch-device connections that is configured to perform optical data exchange functionality that includes transmitting and receiving optical data via optical data port(s) in the row 804*a* of optical data ports in the optical communication system 804, as well as perform networking device connection and communication functionality that includes connecting to and communicating with other networking devices via the device connectors 806*a*-806*d*. As such, the networking device 500 may be optimized for networking device utilization scenarios that include a rack having a 1RU space for the networking device 800, that houses a plurality of server device(s) and/or storage device(s) that require connection to the optical data ports in the optical communication system 804, and that require connection to other networking devices via the device connectors 806*a*-806*d*, in order to enable communication within the rack, outside that rack, via a network, and/or in other manners that one of skill in the art in possession of the present disclosure will recognize as being enabled by the networking device 800 as configured in FIGS. 8A and 8B.

Figure 9A:
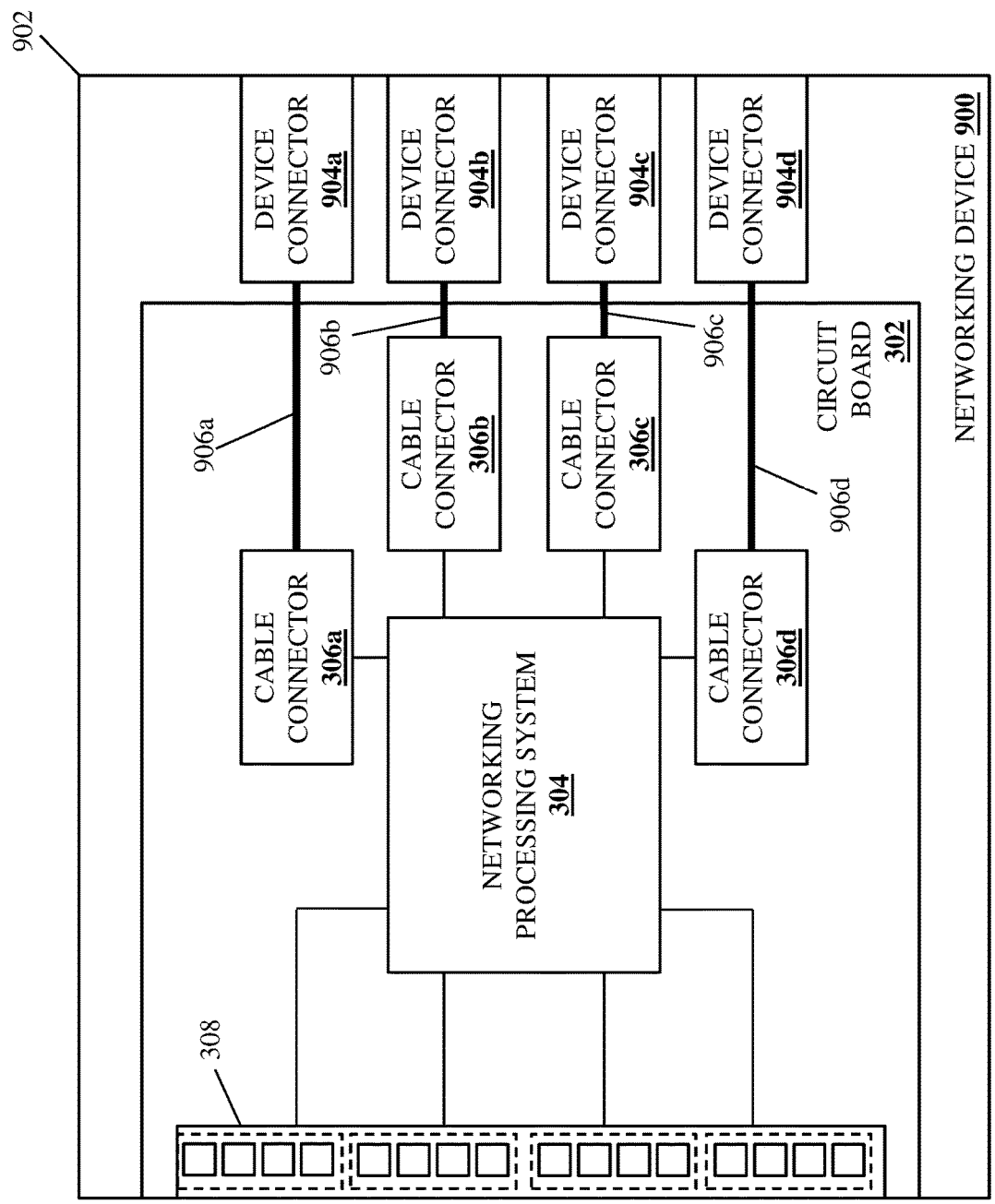
FIG. 9A is a schematic view illustrating an embodiment of a networking device that may be manufactured according to the method of FIG. 4 using the networking circuit board of FIG. 3.
Figure 9B:
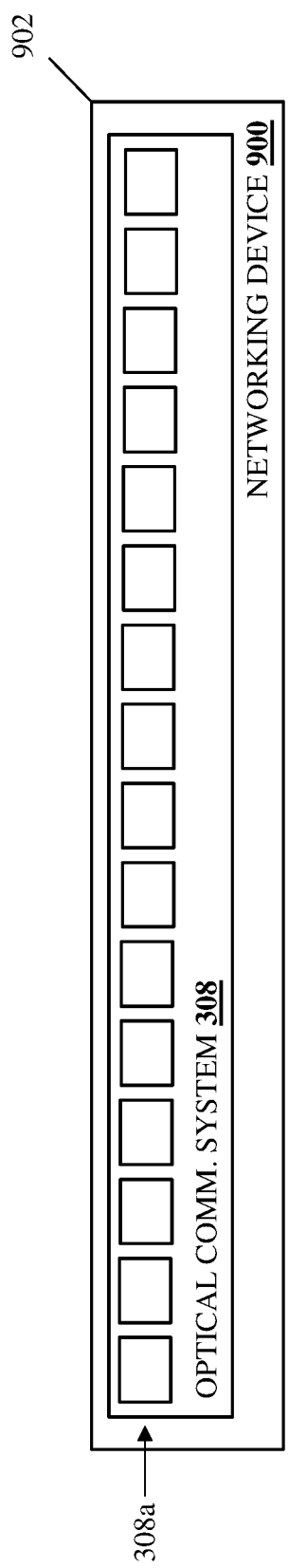
FIG. 9B is a schematic front view illustrating an embodiment of the networking device of FIG. 9A.

As will be appreciated by one of skill in the art in possession of the present disclosure, the networking circuit board 300 described above with reference to FIGS. 3A and 3B may be utilized to manufacture networking devices with networking device functionality similar to that described above for the networking device 800. With reference to FIGS. 9A and 9B, a networking device 900 is illustrated that includes a networking device chassis 902, and the networking circuit board 300 is located in the networking device chassis 902 (e.g., after having been provided in the networking device chassis 902 at block 406 or block 410 of the method 400). Furthermore, a networking subsystem that is included in the networking device chassis 902 is provided by a device connection system that, in the example below, is provided by a plurality of device connectors 904a, 904b, 904c, and 904d that are accessible on an outer surface of the networking device chassis 902 and that may each be configured to couple the networking device 900 to another networking device.

In the illustrated embodiment, each of the cable connectors 306a-306d may be cabled to the device connectors 904a-904d via a respective high-speed cable that may be provided by FLYOVER® cable available from SAMTEC® of New Albany, Indiana, United States. However, while particular cables are described, one of skill in the art in possession of the present disclosure will appreciate how other cables may be used to cable the networking circuit board 200 to the device connectors 904a-904d while remaining within the scope of the present disclosure as well. In the specific example illustrated in FIGS. 9A and 9B, the cable connector 306a is cabled to the device connector 904a via a cable 906a, the cable connector 306b is cabled to the device connector 904b via a cable 906b, the cable connector 306c is cabled to the device connector 904c via a cable 906c, and the cable connector 306d is cabled to the device connector 904d via a cable 906d.

As will be appreciated by one of skill in the art in possession of the present disclosure, the specific example of the optical communication system 308 and the cabling of the cable connectors 306a-306d to the device connectors 904a-904d may provide the networking device 900 as a "disaggregated 1RU fixed port" switch device with inter-switch-device connections that is configured to perform optical data exchange functionality that includes transmitting and receiving optical data via optical data port(s) in the row 308a of optical data ports in the optical communication system 308, as well as perform networking device connection and communication functionality that includes connecting to and communicating with other networking devices via the device connectors 904a-904d. As such, the networking device 900 may be optimized for networking device utilization scenarios that include a rack having a 1RU space for the networking device 900, that houses a plurality of server device(s) and/or storage device(s) that require connection to the optical data ports in the optical communication system 308, and that requires connection to other networking devices via the device connectors 904a-904d, in order to enable communication within the rack, outside that rack, via a network, and/or in other manners that one of skill in the art in possession of the present disclosure will recognize as being enabled by the networking device 900 as configured in FIGS. 9A and 9B.

Figure 10A:
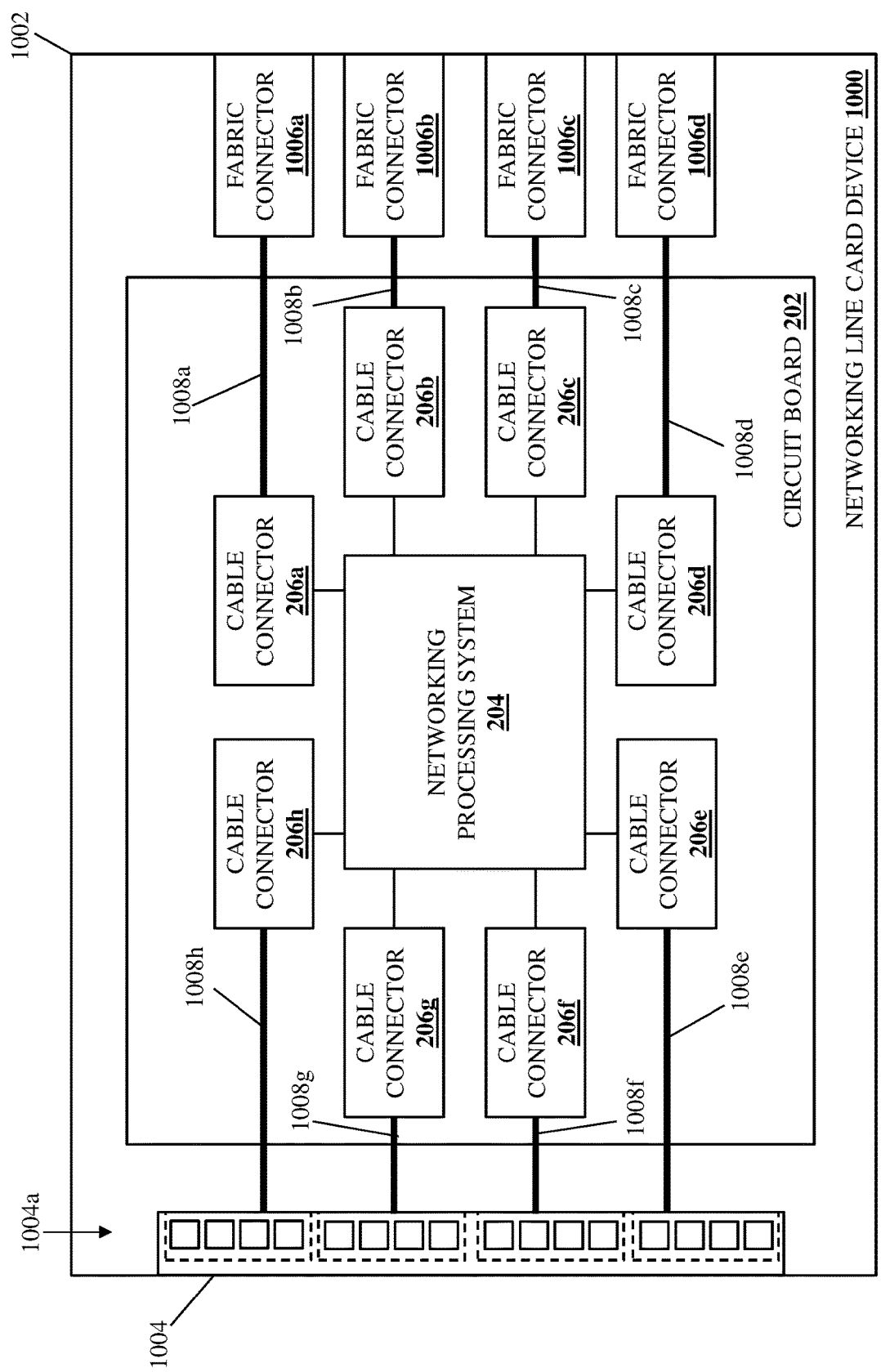
FIG. 10A is a schematic view illustrating an embodiment of a networking device that may be manufactured according to the method of FIG. 4 using the networking circuit board of FIG. 2.
Figure 10B:
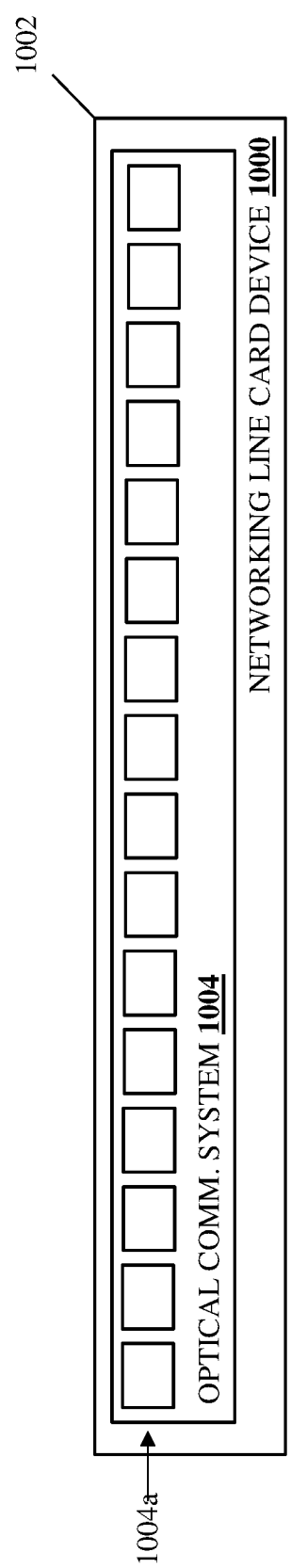
FIG. 10B is a schematic front view illustrating an embodiment of the networking device of FIG. 10A.

With reference to FIGS. 10A and 10B, an embodiment of a networking line card device 1000 is illustrated that may be provided as any of the plurality of first networking devices manufactured according to blocks 406 and 408 of the method 400, or provided as any of the plurality of second networking devices manufactured according to blocks 410 and 412 of the method 400. In the illustrated embodiment, the networking line card device 1000 includes a networking line card device chassis 1002, and the networking circuit board 200 is located in the networking line card device chassis 1002 (e.g., after having been provided in the networking line card device chassis 1002 at block 406 or block 410 of the method 400). Furthermore, a first networking subsystem that is included in the networking line card device chassis 1002 is provided by an optical communication system 1004 that may be similar to the optical communication system 308 discussed above with reference to FIG. 3A, but that is not mounted to the circuit board 202 on the networking circuit board 200, and rather is mounted to, connected, or otherwise coupled to the networking line card device chassis 1002. Further still, a second networking subsystem that is included in the networking line card device chassis 1002 is provided by a fabric connection system that, in the example below, is provided by a plurality of fabric connectors 1006a, 1006b, 1006c, and 1006d that are accessible on the networking line card device chassis 1002 and that may each be configured to couple the networking line card device 1000 to networking fabric card devices and other networking line card devices.

In the illustrated example, the optical communication system 1004 includes a row 1004a of optical data ports that may each be accessible on the networking line card device chassis 1002, and the device connection system includes a row of the fabric connectors 1006a-1006d that may each be accessible on the networking line card device chassis 1002 opposite the networking line card device chassis 1002 from the optical communication system 1004. In the illustrated embodiment, each of the cable connectors 206a-206d may be cabled to the device connectors 1006a-1006d, and each of the cable connectors 206e-206h may be cabled to the optical communication system 1004, via a respective high-speed cable that may be provided by FLYOVER® cable available from SAMTEC® of New Albany, Indiana, United States. However, while particular cables are described, one of skill in the art in possession of the present disclosure will appreciate how other cables may be used to cable the networking circuit board 200 to the device connectors 1006a-1006d and the optical communication system 1004 while remaining within the scope of the present disclosure as well.

In the specific example illustrated in FIGS. 10A and 10B, the cable connector 206a is cabled to the device connector 1006a via a cable 1008a, the cable connector 206b is cabled to the device connector 1006b via a cable 1008b, the cable connector 206c is cabled to the device connector 1006c via a cable 1008c, and the cable connector 206d is cabled to the device connector 1006d via a cable 1008d. Similarly, the cable connector 206e is cabled to the optical communication system 1004 via a cable 1008e that couples the cable connector 206e to a first subset of the row 1004a of optical data ports (e.g., four optical data ports in the illustrated embodiment), the cable connector 206f is cabled to the optical communication system 1004 via a cable 1008f that couples the cable connector 206f to a second subset of the row 1004a of optical data ports (e.g., four optical data ports in the illustrated embodiment), the cable connector 206g is cabled to the optical communication system 1004 via a cable 1008g that couples the cable connector 206g to a third subset of the row 1004a of optical data ports (e.g., four optical data ports in the illustrated embodiment), and the cable connector 206h is cabled to the optical communication system 1004 via a cable 1008h that couples the cable connector 206h to a fourth subset of the row 1004a of optical data ports (e.g., four optical data ports in the illustrated embodiment). However, while each of the cable connectors 206e, 206f, 206g, and 206h are illustrated as being cabled to a respective subset of four optical data ports in the row 1004a of optical data ports in the optical communication system 1004, one of skill in the art in possession of the present disclosure will appreciate how cable connectors may be connected to different numbers of optical data ports while remaining within the scope of the present disclosure as well.

As will be appreciated by one of skill in the art in possession of the present disclosure, the specific example of the cabling of the cable connectors 206a-206d to the fabric connectors 1006a-1006d, and the cabling of the cable connectors 206e-206h to the optical communication system 1004, may provide the networking device 1000 as a "modular line card" device that is configured to perform optical data exchange functionality that includes transmitting and receiving optical data via optical data port(s) in the row 1004a of optical data ports in the optical communication system 1004, as well as perform networking fabric device connection and communication functionality that includes connecting to and communicating with other networking lines card devices and/or networking fabric card devices via the device connectors 1006a-1006d. As such, the networking device 1000 may be optimized for networking device utilization scenarios that may include a modular chassis that houses networking fabric card device(s) and other networking line card devices, discussed in further detail below, in order to allow server devices, storage devices, and/or other devices to connect to the optical data ports in the optical communication system 1004, and to interconnect with networking fabric card device(s) and networking line card device(s) via the device connectors 806a-806d, in order to enable communication within the modular chassis, outside that modular chassis, via a network, and/or in other manners that one of skill in the art in possession of the present disclosure will recognize as being enabled by the networking line card device 1000 as configured in FIGS. 10A and 10B.

Figure 11A:
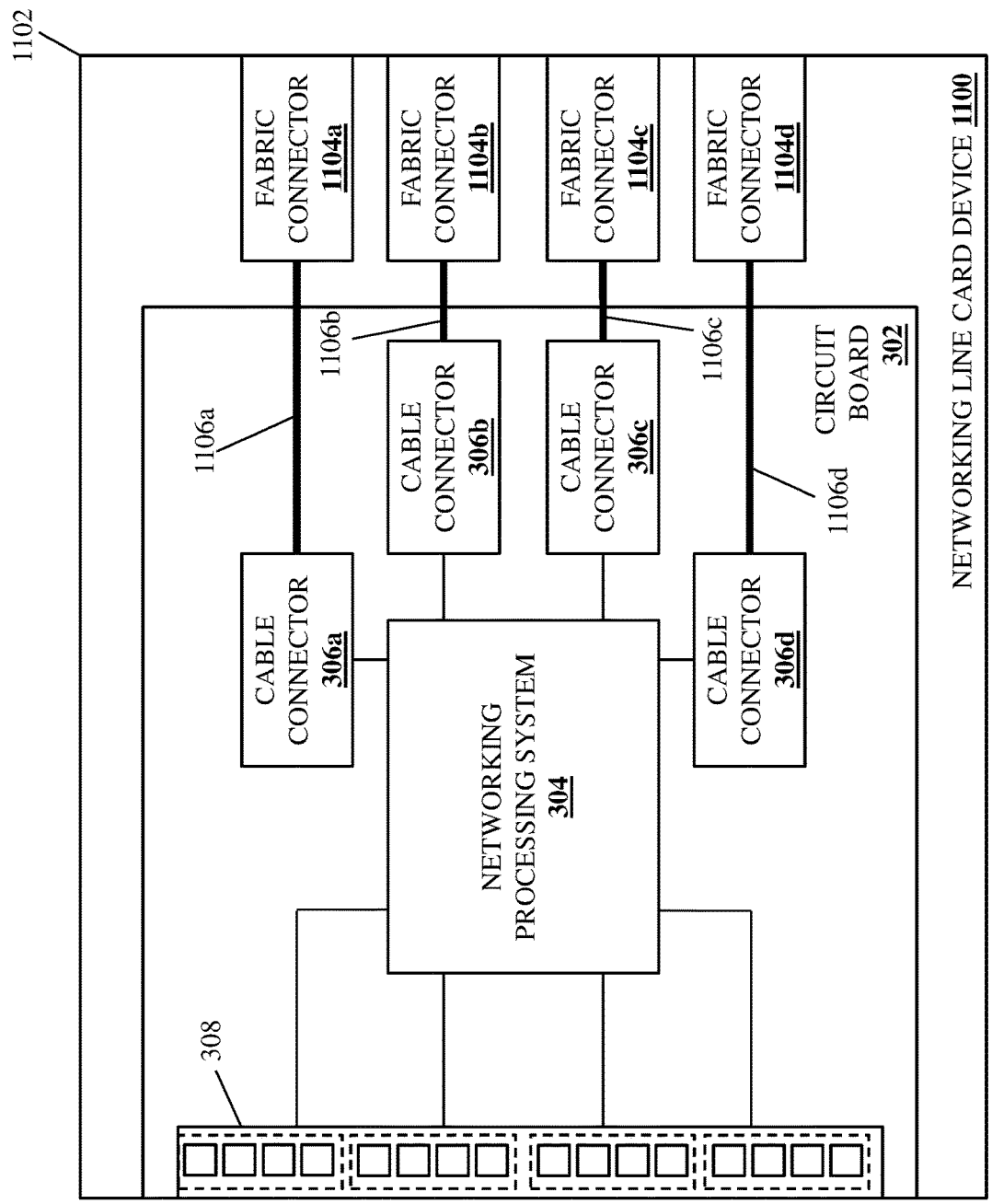
FIG. 11A is a schematic view illustrating an embodiment of a networking device that may be manufactured according to the method of FIG. 4 using the networking circuit board of FIG. 3.
Figure 11B:
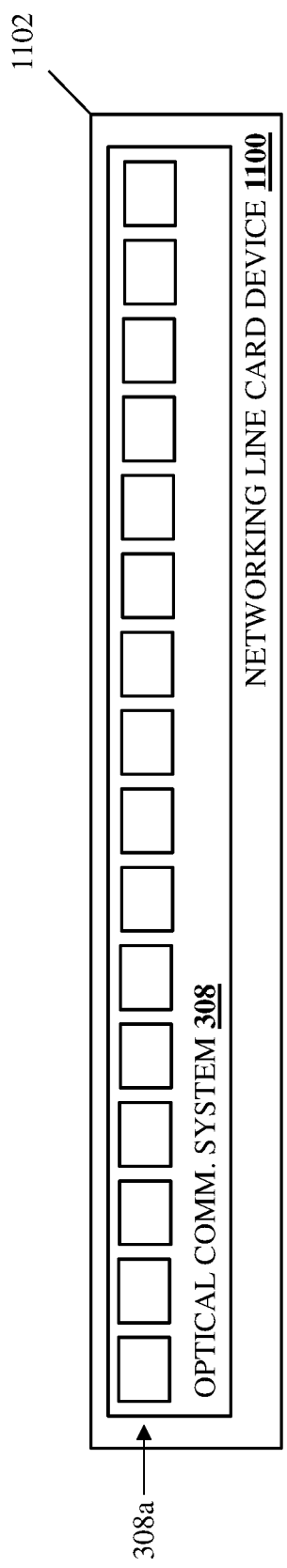
FIG. 11B is a schematic front view illustrating an embodiment of the networking device of FIG. 11A.

As will be appreciated by one of skill in the art in possession of the present disclosure, the networking circuit board 300 described above with reference to FIGS. 3A and 3B may be utilized to manufacture networking devices with networking device functionality similar to that described above for the networking line card device 1000. With reference to FIGS. 11A and 11B, a networking line card device 1100 is illustrated that includes a networking line card device chassis 1102, and the networking circuit board 300 is located in the networking line card device chassis 1102 (e.g., after having been provided in the networking line card device chassis 1102 at block 406 or block 410 of the method 400). Furthermore, a networking subsystem that is included in the networking line card device chassis 1102 is provided by a fabric connection system that, in the example below, is provided by a plurality of fabric connectors 1104a, 1104b, 1104c, and 1104d that are accessible on the networking line card device chassis 1102 and that are each configured to couple the networking line card device 1100 to networking fabric card device(s) and other networking line card device(s).

In the illustrated embodiment, each of the cable connectors 306a-306d may be cabled to the fabric connectors 1104a-1104d via a respective high-speed cable that may be provided by FLYOVER® cable available from SAMTEC® of New Albany, Indiana, United States. However, while particular cables are described, one of skill in the art in possession of the present disclosure will appreciate how other cables may be used to cable the networking circuit board 200 to the fabric connectors 1104a-1104d while remaining within the scope of the present disclosure as well. In the specific example illustrated in FIGS. 11A and 11B, the cable connector 306a is cabled to the fabric connector 1104a via a cable 1106a, the cable connector 306b is cabled to the device connector 1104b via a cable 1106b, the cable connector 306c is cabled to the device connector 1104c via a cable 1106c, and the cable connector 306d is cabled to the device connector 1104d via a cable 1106d.

As will be appreciated by one of skill in the art in possession of the present disclosure, the specific example of the optical communication system 308 and the cabling of the cable connectors 306a-306d to the fabric connectors 1104a-1104d may provide the networking device 1100 as a "modular line card" device that is configured to perform optical data exchange functionality that includes transmitting and receiving optical data via optical data port(s) in the row 308a of optical data ports in the optical communication system 308, as well as perform networking fabric device connection and communication functionality that includes connecting to and communicating with other networking lines card devices and/or networking fabric card devices via the device connectors 1104a-1104d. As such, the networking device 1100 may be optimized for networking device utilization scenarios that include a modular chassis that houses networking fabric card device(s) and other networking line card devices, discussed in further detail below, in order to allow server devices, storage devices, and/or other devices to connect to the optical data ports in the optical communication system 308, and to interconnect with the networking fabric card device(s) and networking line card device(s) via the device connectors 1104a-1104d, in order to enable communication within the modular chassis, outside that modular chassis, via a network, and/or in other manners that one of skill in the art in possession of the present disclosure will recognize as being enabled by the networking line card device 1100 as configured in FIGS. 11A and 11B.

Figure 12:
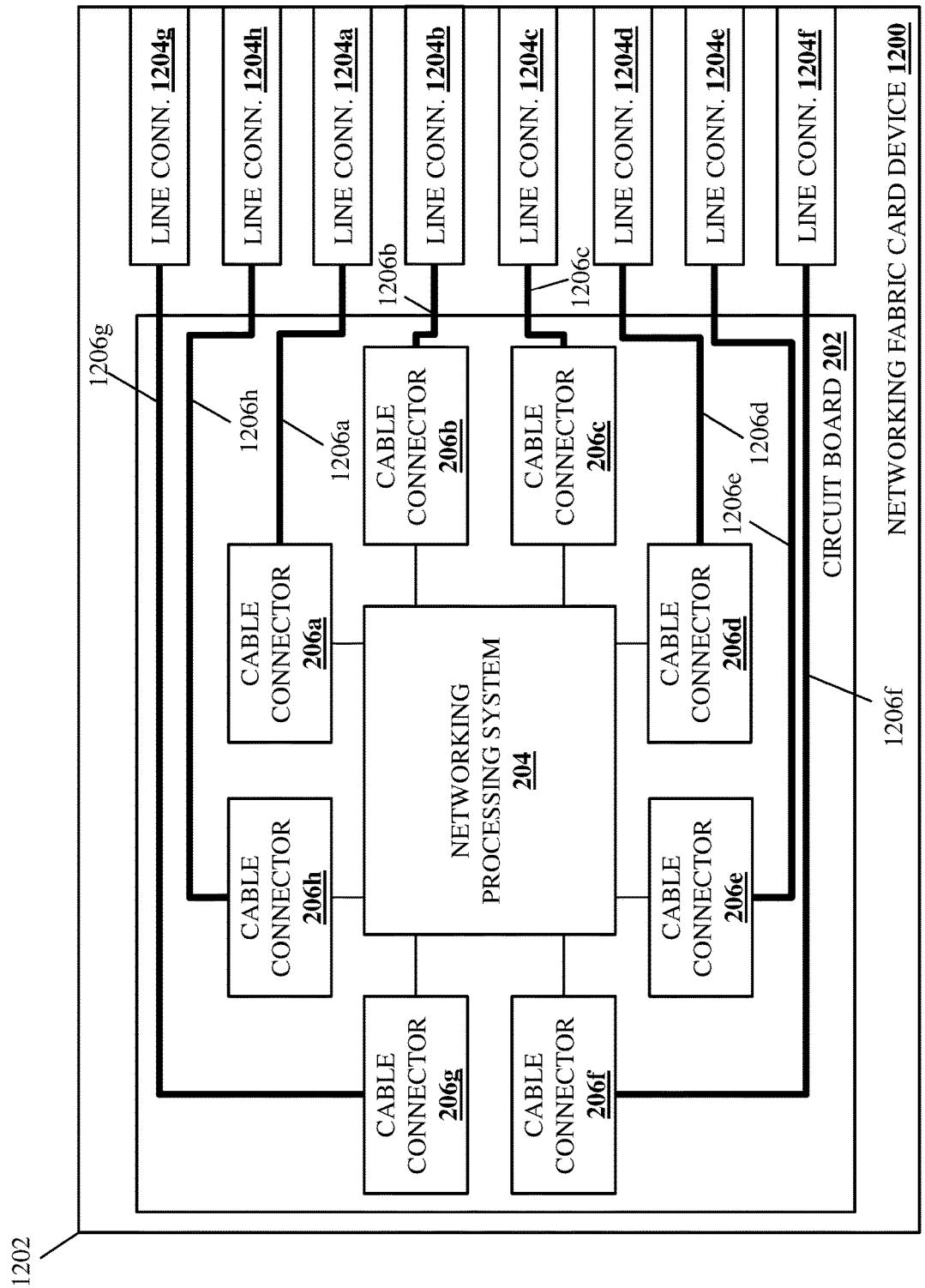
FIG. 12 is a schematic view illustrating an embodiment of a networking device that may be manufactured according to the method of FIG. 4 using the networking circuit board of FIG. 2.

With reference to FIG. 12, an embodiment of a networking fabric card device 1200 is illustrated that may be provided as any of the plurality of first networking devices manufactured according to blocks 406 and 408 of the method 400, or provided as any of the plurality of second networking devices manufactured according to blocks 410 and 412 of the method 400. In the illustrated embodiment, the networking fabric card device 1200 includes a networking fabric card device chassis 1202, and the networking circuit board 200 is located in the networking fabric card device chassis 1202 (e.g., after having been provided in the networking fabric card device chassis 1202 at block 406 or block 410 of the method 400). Furthermore, a networking subsystem that is included in the networking fabric card device chassis 1202 is provided by a line connection system that, in the example below, is provided by a plurality of line connectors 1204a, 1204b, 1204c, 1204d, 1204e, 1204f, 1204g, and 1204h that are accessible on the networking fabric card device chassis 1202 and that are each configured to couple the networking fabric card device 1200 to networking line card device(s) and other networking fabric card device(s).

In the illustrated embodiment, each of the cable connectors 206a-206h may be cabled to respective line connectors 1204a-1204h via a respective high-speed cable that may be provided by FLYOVER® cable available from SAMTEC® of New Albany, Indiana, United States. However, while particular cables are described, one of skill in the art in possession of the present disclosure will appreciate how other cables may be used to cable the networking circuit board 200 to the line connectors 1204a-1204h while remaining within the scope of the present disclosure as well. In the specific example illustrated in FIG. 12, the cable connector 206a is cabled to the card 1204a via a cable 1206a, the cable connector 206b is cabled to the card 1204b via a cable

1206*b*, the cable connector 206*c* is cabled to the card 1204*c* via a cable 1206*c*, the cable connector 206*d* is cabled to the card 1204*d* via a cable 1206*d*, the cable connector 206*e* is cabled to the card 1204*e* via a cable 1206*e*, the cable connector 206*f* is cabled to the card 1204*f* via a cable 1206*f*, the cable connector 206*g* is cabled to the card 1204*g* via a cable 1206*g*, and the cable connector 206*h* is cabled to the card 1204*h* via a cable 1206*h*.

As will be appreciated by one of skill in the art in possession of the present disclosure, the specific example of the cabling of the cable connectors 206*a*-206*h* to the cards 1204*a*-1204*h* may provide the networking device 1200 as a "modular fabric card" device that is configured to perform networking line device connection and communication functionality that includes connecting to and communicating with networking lines card devices and/or other networking fabric card devices via the line connectors 1204*a*-1204*f*. As such, the networking device 1200 may be optimized for networking device utilization scenarios that include a modular chassis that houses networking fabric card device(s) and other networking line card devices, discussed in further detail below, in order to allow server devices, storage devices, and/or other devices to connect to the networking line card devices, and to interconnect with the networking fabric card device(s) and networking line card device(s) via the line connectors 1204*a*-1204*h*, in order to enable communication within the modular chassis, outside that modular chassis, via a network, and/or in other manners that one of skill in the art in possession of the present disclosure will recognize as being enabled by the networking fabric card device 1200 as configured in FIG. 12.

Figure 13:
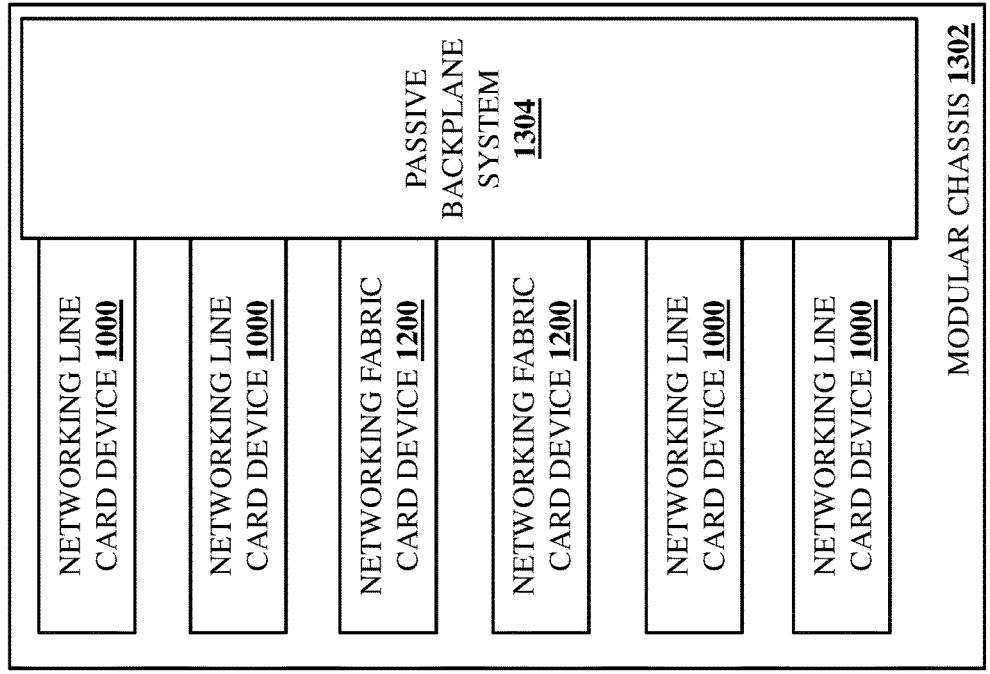
FIG. 13 is a schematic view illustrating an embodiment of a networking system that may be provided using the networking device of FIGS. 10A/10B and 12.

With reference to FIG. 13, an embodiment of a networking system 1300 is illustrated as an example of the use of the networking line card device 1000 discussed above with reference to FIGS. 10A and 10B, and the networking fabric card device 1200 discussed above with reference to FIG. 12. For example, the networking system 1300 may include a modular chassis 1302 housing a passive backplane system 1304 that may be coupled to a plurality of the networking line card devices 1000 discussed above with reference to FIGS. 10A and 10B, as well as to a plurality of the networking fabric card devices 1200 discussed above with reference to FIG. 12. As will be appreciated by one of skill in the art in possession of the present disclosure, the passive backplane system 1304 may be provided by a circuit board (e.g., a PCB) that includes connectors that are configured to couple to the fabric connectors 1006*a*-1006*d* on the networking line card devices 1000, and connectors that are configured to couple to the line connectors 1204*a*-1204*g* on the networking line card devices 1200, in order to enable the networking system configuration illustrated in FIG. 13. Furthermore, the passive backplane system 1304 may provide any of a plurality of interconnections between any of the networking line card devices 1000 and networking fabric card devices 1200.

Figure 14:
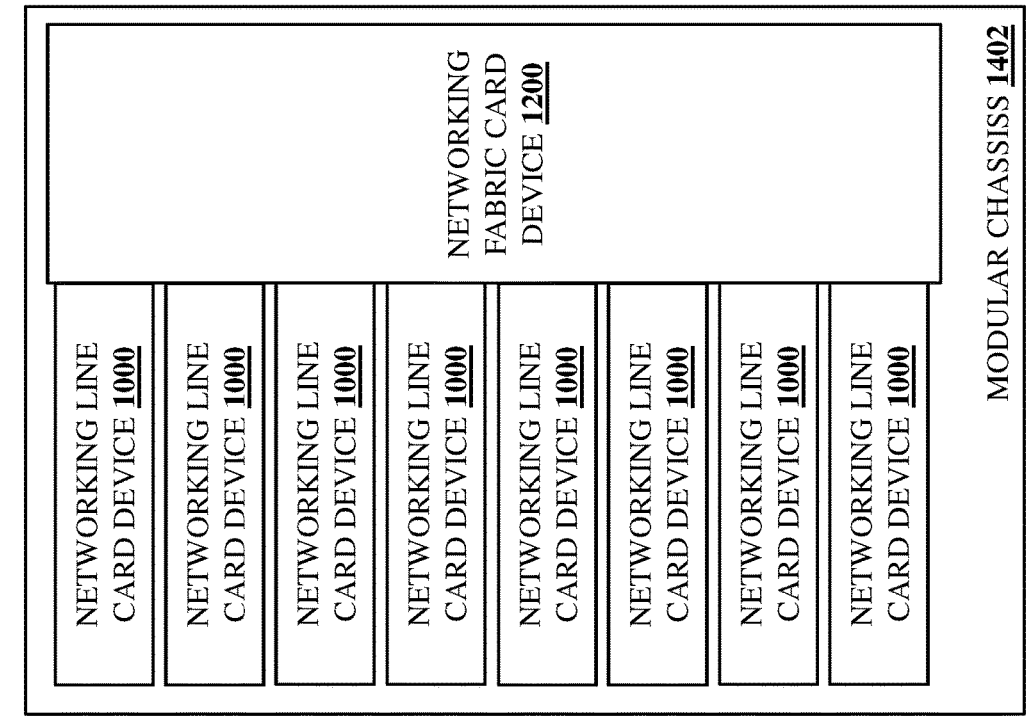
FIG. 14 is a schematic view illustrating an embodiment of a networking system that may be provided using the networking device of FIGS. 10A/10B and 12.

With reference to FIG. 14, an embodiment of a networking system 1400 is illustrated as an example of the use of the networking line card device 1000 discussed above with reference to FIGS. 10A and 10B, and the networking fabric card device 1200 discussed above with reference to FIG. 12. For example, the networking system 1300 may include a modular chassis 1402 housing the networking fabric card device 1200 discussed above with reference to FIG. 12*a* coupled to a plurality of the networking line card devices 1000 discussed above with reference to FIGS. 10A and 10B. As will be appreciated by one of skill in the art in possession of the present disclosure, the fabric connectors 1006*a*-1006*d* on the networking line card devices 1000 may be configured to couple to the line connectors 1204*a*-1204*g* on the networking line card devices 1200, in order to enable the networking system configuration illustrated in FIG. 14.

Thus, systems and methods have been described that provide a plurality of networking circuit boards having a common networking circuit board configuration that allows a plurality of different networking device functionality to be configured for different networking devices, thus allowing the "same" networking circuit board (e.g., different physical networking circuit boards all with the same networking circuit board configuration) to be utilized to manufacture different types of networking devices (e.g., a 1RU networking device, a 2RU networking device, a disaggregated networking device, a modular line card, a modular fabric card, and/or any other networking devices that would be apparent to one of skill in the art in possession of the present disclosure). For example, the method for manufacturing networking devices of the present disclosure may includes providing circuit boards each having an NPU mounted to that circuit board, and respective cable connectors mounted to that circuit board and coupled to that NPU. First networking devices are manufactured by providing one of the circuit boards in a chassis in each first networking device, and cabling at least some of the cable connectors on that circuit board to first subsystem(s) in that first networking device in order to configure that first networking device to perform first functionality. Second networking devices are manufactured by providing a respective one of the circuit boards in a chassis in each second networking device, and cabling at least some of the cable connectors on that circuit board to second subsystem(s) in that second networking device in order to configure that second networking device to perform second functionality that is different than the first functionality.

As such, a networking circuit board design is provided with cable connectors that may be used to provide different networking device configurations, including front and/or rear I/O functionality (e.g., I/O connections on a front surface and/or a rear surface of a networking device chassis) for rack mounted networking devices, height reductions for disaggregated networking devices (e.g., from 2RU heights to 1RU heights via the provisioning of device connectors opposite the networking device chassis from the optical data ports), and/or other networking device configurations that would be apparent to one of skill in the art in possession of the present disclosure. As will be appreciated by one of skill in the art in possession of the present disclosure, the networking circuit board designs described herein allow multiple networking device products lines to be based on that networking circuit board while incurring development costs similar to a single networking device product line, and reduce development costs for some networking devices configurations to a level that would otherwise be prohibitive for many networking device manufacturers. The reductions in development costs discussed above may allow networking device manufacturers to bring other networking device development operations (e.g., the development of the networking device chassis) "in-house" so that other networking device operational factors (e.g., fan operation, acoustics, power usage, energy density) associated with the networking device may be optimized as well, and may reduce time-to-market for networking device designs to increase networking device sales.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A method for manufacturing networking devices, comprising:
providing a plurality of networking circuit boards each having a networking circuit board configuration that includes a networking processing system mounted to that networking circuit board, and a respective plurality of cable connectors that are mounted to that networking circuit board and coupled to the networking processing system mounted to that networking circuit board;
manufacturing a networking line card device by:
providing a first networking circuit board included in the plurality of networking circuit boards in a networking line card device chassis of the networking line card device; and
cabling at least some of the plurality of cable connectors on the first networking circuit board to at least one networking line card subsystem in the networking line card device in order to configure the networking line card device to perform networking line card device functionality; and
manufacturing a networking fabric card device by:
providing a second networking circuit board included in the plurality of networking circuit boards in a networking fabric card device chassis of the networking fabric card device; and
cabling at least some of the plurality of cable connectors on second networking circuit board to at least one networking fabric card subsystem in the networking fabric card device in order to configure the networking fabric card device to perform networking fabric card device functionality that is different than the networking line card device functionality.

2. The method of claim 1, further comprising:
coupling the networking line card device to the networking fabric card device via a backplane system.

3. The method of claim 1, wherein the at least one first-networking line card subsystem includes an optical data port subsystem, and wherein the networking line card device functionality includes optical data exchange functionality that includes transmitting and receiving optical data via the optical data port subsystem.

4. The method of claim 1,
further comprising:
connecting the networking line card device directly to the networking fabric card device.

5. The method of claim 1, wherein the at least one networking line card subsystem includes a fabric connector subsystem, and wherein the networking line card device functionality includes networking fabric card device connection and communication functionality that includes connecting to and communicating with the networking fabric card device.

6. The method of claim 1, further comprising:
manufacturing a networking device by:
providing a third networking circuit board included in the plurality of networking circuit boards in a networking device chassis of the networking device; and
cabling at least some of the plurality of cable connectors on the third networking circuit board to at least one optical data port subsystem in the networking device chassis that includes a plurality of optical data ports.

7. The method of claim 6, wherein the networking device chassis is a 1 Rack Unit (1RU) chassis, and
wherein the at least one optical data port subsystem includes at least one row of plurality of optical data ports that are accessible on a first surface of the networking device chassis.

8. A method for manufacturing networking devices, comprising:
providing a plurality of networking circuit boards each having a networking circuit board configuration that includes a networking processing system mounted to that networking circuit board, a respective plurality of cable connectors that are mounted to that networking circuit board and coupled to the networking processing system mounted to that networking circuit board, and an optical port subsystem that is mounted to that networking circuit board and coupled to the networking processing system;
manufacturing each of a plurality of first networking devices by:
providing a respective one of the plurality of networking circuit boards in a respective first networking device chassis in that first networking device; and
cabling at least some of the plurality of cable connectors on that respective one of the plurality of networking circuit boards to at least one first networking subsystem in that first networking device in order to configure that first networking device to perform first networking device functionality; and
manufacturing each of a plurality of second networking devices by:
providing a respective one of the plurality of networking circuit boards in a respective second networking device chassis in that second networking device; and
cabling at least some of the plurality of cable connectors on that respective one of the plurality of networking circuit boards to at least one second networking subsystem in that second networking device in order to configure that second networking device to perform second networking device functionality that is different than the first networking device functionality.

9. The method of claim 8, further comprising:
manufacturing each of a plurality of third networking devices by:
providing a respective one of the plurality of networking circuit boards in a respective third networking device chassis in that third networking device; and
cabling at least some of the plurality of cable connectors on that respective one of the plurality of networking circuit boards to at least one third networking subsystem in that third networking device in order to configure that third networking device to perform third networking device functionality.

10. The method of claim 8, wherein each respective first networking device chassis is a 2 Rack Unit (2RU) chassis, and
wherein the optical data port subsystem includes two rows of optical data ports.

11. The method of claim 8, wherein the at least one first networking subsystem includes a device connector subsystem, and wherein the first networking device functionality includes networking device connection and communication functionality that includes connecting to and communicating with another networking device.

12. The method of claim 8, wherein each respective first networking device chassis is a 1 Rack Unit (1RU) chassis,
wherein the optical data port subsystem includes one row of optical data ports on a first surface of that first networking device chassis, and
wherein the at least one first networking subsystem includes a device connector subsystem on a second surface of that first networking device chassis that is opposite the first surface, and the first networking device functionality includes networking device connection and communication functionality that includes connecting to and communicating with another networking device.

13. The method of claim 8, wherein the at least one first networking subsystem includes a fabric connector subsystem, and wherein the first networking device functionality includes fabric card connection and communication functionality that includes connecting to and communicating with a fabric card device.

14. The method of claim 13, wherein the at least one second networking subsystem includes a line connector subsystem, and wherein the second networking device functionality includes line card connection and communication functionality that includes connecting to and communicating with a line card device.

15. A method for manufacturing networking devices, comprising:
providing a plurality of first networking circuit boards each having a first networking circuit board configuration that includes a first networking processing system mounted to that first networking circuit board, and a respective plurality of first cable connectors that are mounted to that first networking circuit board and coupled to the first networking processing system mounted to that first networking circuit board;
manufacturing each of a plurality of networking fabric card devices by:
providing a respective one of the plurality of first networking circuit boards in a respective networking fabric card device chassis in that networking fabric card device; and
cabling at least some of the plurality of first cable connectors on that respective one of the plurality of first networking circuit boards to at least one networking fabric card subsystem in that networking fabric card device in order to configure that networking fabric card device to perform networking fabric card device functionality;
providing a plurality of second networking circuit boards each having a second networking circuit board configuration that includes a second networking processing system mounted to that second networking circuit board, a respective plurality of second cable connectors that are mounted to that second networking circuit board and coupled to the second networking processing system mounted to that second networking circuit board, and an optical port subsystem that is mounted to that second networking circuit board and coupled to the second networking processing system; and
manufacturing each of a plurality of networking line card devices by:
providing a respective one of the plurality of second networking circuit boards in a respective networking line card device chassis in that networking line card device; and
cabling at least some of the plurality of second cable connectors on that respective one of the plurality of second networking circuit boards to at least one networking line card subsystem in that networking line card device in order to configure that networking line card device to perform networking line card device functionality that is different than the networking fabric card device functionality.

16. The method of claim 15, further comprising:
coupling each of the plurality of networking line card devices to at least one of the plurality of networking fabric card devices via a backplane system.

17. The method of claim 15,
further comprising:
connecting each of the plurality of networking line card devices directly to one of the plurality of networking fabric card devices.

18. The method of claim 15, wherein
the at least one networking line card subsystem includes a fabric connector subsystem, and wherein the networking line card device functionality includes networking fabric card device connection and communication functionality that includes connecting to and communicating with at least one of the plurality of networking fabric card devices.

19. The method of claim 15,
further comprising:
manufacturing each of a plurality of networking devices by:
providing a respective one of the plurality of first networking circuit boards in a respective networking device chassis in that networking device; and
cabling at least some of the plurality of first cable connectors on that respective one of the plurality of first networking circuit boards to at least one optical data port subsystem that is included in the respective networking device chassis in that networking device and that includes a plurality of optical data ports.

20. The method of claim 19, further comprising:
manufacturing each of a plurality of networking devices by:
providing a respective one of the plurality of second networking circuit boards in a respective networking device chassis in that networking device; and
cabling at least some of the plurality of second cable connectors on that respective one of the plurality of second networking circuit boards to at least one optical data port subsystem that is included in the respective networking device chassis in that networking device and that includes a plurality of optical data ports.

\* \* \* \* \*